United States Patent
Kim et al.

(10) Patent No.: US 10,812,166 B2
(45) Date of Patent: Oct. 20, 2020

(54) BEAM STEERING DIGITAL PREDISTORTION

(71) Applicant: NanoSemi, Inc., Waltham, MA (US)

(72) Inventors: Helen H. Kim, Sudbury, MA (US); Alexandre Megretski, Concord, MA (US); Yan Li, Lexington, MA (US); Kevin Chuang, Cambridge, MA (US); Zohaib Mahmood, Ashland, MA (US); Yanyu Huang, Bedford, MA (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 16/339,528

(22) PCT Filed: Oct. 6, 2017

(86) PCT No.: PCT/US2017/055592
§ 371 (c)(1),
(2) Date: Apr. 4, 2019

(87) PCT Pub. No.: WO2018/067969
PCT Pub. Date: Apr. 12, 2018

(65) Prior Publication Data
US 2019/0238204 A1 Aug. 1, 2019

Related U.S. Application Data

(60) Provisional application No. 62/405,329, filed on Oct. 7, 2016.

(51) Int. Cl.
*H04B 7/06* (2006.01)
*H01Q 3/26* (2006.01)
(Continued)

(52) U.S. Cl.
CPC ......... *H04B 7/0639* (2013.01); *H01Q 3/2605* (2013.01); *H01Q 3/2652* (2013.01);
(Continued)

(58) Field of Classification Search
CPC combination set(s) only.
See application file for complete search history.

(56) References Cited

U.S. PATENT DOCUMENTS

| 4,979,126 A | 12/1990 | Pao et al. |
| 5,819,165 A | 10/1998 | Hulkko et al. |

(Continued)

FOREIGN PATENT DOCUMENTS

| EP | 0916967 A2 | 5/1999 |
| EP | 1560329 A1 | 8/2005 |

(Continued)

OTHER PUBLICATIONS

Aguirre, et al., "On the Interpretation and Practice of Dynamical Differences Between Hammerstein and Wiener Models", IEEE Proceedings on Control TheoryAppl; vol. 152, No. 4, Jul. 2005, pp. 349-356.

(Continued)

*Primary Examiner* — Linda Wong
(74) *Attorney, Agent, or Firm* — Occhiuti & Rohlicek LLP

(57) ABSTRACT

An approach to predistortion of a first set of signals for an antenna array allows beam-steering without corrupting spectrum away from the main beam and where other users may be located. In some implementations, the predistorter uses fewer than one predistorter per signal (i.e., per power amplifier or per antenna), and/or has the computational complexity of such fewer predistorters, to generate predistortions of the first set of signals for amplification and transmission via the antenna array.

28 Claims, 11 Drawing Sheets

(51) Int. Cl.
*H03F 1/32* (2006.01)
*H04B 1/04* (2006.01)
*H04L 27/36* (2006.01)

(52) U.S. Cl.
CPC ............. *H03F 1/3247* (2013.01); *H04B 1/04* (2013.01); *H04L 27/367* (2013.01); *H04B 2001/0416* (2013.01); *H04B 2001/0425* (2013.01)

(56) References Cited

U.S. PATENT DOCUMENTS

| | | | |
|---|---|---|---|
| 5,980,457 | A | 11/1999 | Averkiou |
| 6,052,412 | A | 4/2000 | Ruether et al. |
| 6,240,278 | B1 | 5/2001 | Midya et al. |
| 6,288,610 | B1 * | 9/2001 | Miyashita ............. H03F 1/3223 330/149 |
| 7,289,773 | B2 | 10/2007 | Braithwaite |
| 7,295,815 | B1 | 11/2007 | Wright et al. |
| 7,333,557 | B2 | 2/2008 | Rashev et al. |
| 7,529,652 | B1 | 5/2009 | Gahinet et al. |
| 7,599,431 | B1 | 10/2009 | Anderson et al. |
| 7,904,033 | B1 | 3/2011 | Wright et al. |
| 8,391,809 | B1 | 3/2013 | Fuller |
| 8,411,730 | B2 | 4/2013 | Maeda |
| 8,446,979 | B1 | 5/2013 | Yee |
| 8,498,590 | B1 | 7/2013 | Rashev et al. |
| 8,519,789 | B2 | 8/2013 | Hawkes |
| 8,576,941 | B2 | 11/2013 | Bai |
| 8,644,437 | B2 | 2/2014 | Kim et al. |
| 8,711,976 | B2 | 4/2014 | Chandrasekaran |
| 8,731,005 | B2 | 5/2014 | Schlee |
| 8,731,105 | B2 | 5/2014 | Bai |
| 9,130,628 | B1 | 9/2015 | Mittal et al. |
| 9,173,173 | B2 | 10/2015 | Wei et al. |
| 9,184,710 | B2 | 11/2015 | Braithwaite |
| 9,226,189 | B1 | 12/2015 | Kularatna et al. |
| 9,252,712 | B2 | 2/2016 | Li et al. |
| 9,331,882 | B2 | 5/2016 | Fehri et al. |
| 9,337,782 | B1 | 5/2016 | Mauer et al. |
| 9,564,876 | B2 | 2/2017 | Kim et al. |
| 9,590,668 | B1 | 3/2017 | Kim et al. |
| 9,595,920 | B2 | 3/2017 | Li et al. |
| 9,614,557 | B1 | 4/2017 | Mayer et al. |
| 9,628,119 | B2 | 4/2017 | Gal et al. |
| 9,749,161 | B1 | 8/2017 | Gal et al. |
| 9,935,810 | B1 | 4/2018 | Hammler et al. |
| 9,973,370 | B1 | 5/2018 | Langer et al. |
| 10,033,413 | B2 | 7/2018 | Pratt |
| 10,079,699 | B1 | 9/2018 | Li et al. |
| 10,080,178 | B2 | 9/2018 | Stapleton et al. |
| 10,141,896 | B2 | 11/2018 | Huang |
| 10,141,961 | B1 | 11/2018 | Huang et al. |
| 10,181,914 | B2 | 1/2019 | Li et al. |
| 10,404,296 | B2 | 9/2019 | Kim et al. |
| 10,447,511 | B2 | 10/2019 | Xie et al. |
| 10,469,109 | B2 | 11/2019 | Gutman et al. |
| 10,523,159 | B2 | 12/2019 | Megretski et al. |
| 10,581,470 | B2 | 3/2020 | Megretski et al. |
| 10,644,657 | B1 | 5/2020 | Megretski et al. |
| 2001/0050592 | A1 | 12/2001 | Wright et al. |
| 2002/0080891 | A1 | 6/2002 | Ahn et al. |
| 2003/0058960 | A1 | 3/2003 | Lee |
| 2003/0184374 | A1 | 10/2003 | Huang et al. |
| 2003/0207680 | A1 | 11/2003 | Yang et al. |
| 2004/0076247 | A1 | 4/2004 | Barak et al. |
| 2004/0116083 | A1 | 6/2004 | Suzuki et al. |
| 2004/0142667 | A1 | 7/2004 | Lochhead et al. |
| 2004/0196922 | A1 | 10/2004 | Leffel |
| 2005/0001684 | A1 | 1/2005 | Braithwaite |
| 2005/0163251 | A1 | 7/2005 | McCallister |
| 2005/0163252 | A1 | 7/2005 | McCallister et al. |
| 2005/0180527 | A1 | 8/2005 | Suzuki et al. |
| 2005/0190857 | A1 | 9/2005 | Braithwaite |
| 2006/0022751 | A1 | 2/2006 | Fuller et al. |
| 2006/0154622 | A1 | 7/2006 | Piirainen |
| 2006/0229036 | A1 | 10/2006 | Muller et al. |
| 2006/0276147 | A1 | 12/2006 | Suzuki |
| 2007/0091992 | A1 | 4/2007 | Dowling |
| 2007/0230557 | A1 | 10/2007 | Balasubramonian et al. |
| 2007/0241812 | A1 | 10/2007 | Yang et al. |
| 2008/0019453 | A1 | 1/2008 | Zhao et al. |
| 2008/0039045 | A1 | 2/2008 | Filipovic et al. |
| 2008/0057882 | A1 | 3/2008 | Singerl |
| 2008/0101502 | A1 | 5/2008 | Navidpour et al. |
| 2008/0247487 | A1 | 10/2008 | Cai et al. |
| 2008/0268795 | A1 | 10/2008 | Saed |
| 2008/0285640 | A1 | 11/2008 | McCallister |
| 2009/0201084 | A1 | 8/2009 | See et al. |
| 2010/0026354 | A1 | 2/2010 | Utsunomiya et al. |
| 2010/0048149 | A1 | 2/2010 | Tang et al. |
| 2010/0225390 | A1 | 9/2010 | Brown et al. |
| 2011/0044158 | A1 | 2/2011 | Tao et al. |
| 2011/0085490 | A1 | 4/2011 | Schlee |
| 2011/0098011 | A1 | 4/2011 | Camp, Jr. et al. |
| 2011/0128992 | A1 | 6/2011 | Maeda et al. |
| 2011/0135035 | A1 | 6/2011 | Bose et al. |
| 2011/0150130 | A1 | 6/2011 | Kenington |
| 2011/0163806 | A1 | 7/2011 | Hongo |
| 2011/0187437 | A1 | 8/2011 | Perreault et al. |
| 2011/0235734 | A1 * | 9/2011 | Kenington ............ H04B 7/0623 375/267 |
| 2011/0255627 | A1 | 10/2011 | Gotman et al. |
| 2011/0273234 | A1 | 11/2011 | Van der Heijen et al. |
| 2011/0273236 | A1 | 11/2011 | Heijden et al. |
| 2012/0093210 | A1 | 4/2012 | Schmidt et al. |
| 2012/0108189 | A1 | 5/2012 | McCallister et al. |
| 2012/0119810 | A1 | 5/2012 | Bai |
| 2012/0119811 | A1 | 5/2012 | Bai et al. |
| 2012/0119831 | A1 | 5/2012 | Bai |
| 2012/0154033 | A1 | 6/2012 | Lozhkin |
| 2012/0154430 | A1 | 6/2012 | Matsushima et al. |
| 2012/0176195 | A1 | 7/2012 | Dawson et al. |
| 2012/0200355 | A1 | 8/2012 | Braithwaite |
| 2012/0219048 | A1 | 8/2012 | Camuffo et al. |
| 2012/0286865 | A1 | 11/2012 | Chandrasekaran |
| 2012/0286985 | A1 | 11/2012 | Chandrasekaran et al. |
| 2012/0293252 | A1 | 11/2012 | Sorrells et al. |
| 2012/0295558 | A1 | 11/2012 | Wang et al. |
| 2013/0033317 | A1 | 2/2013 | Hawkes |
| 2013/0034188 | A1 | 2/2013 | Rashev et al. |
| 2013/0044791 | A1 | 2/2013 | Rimini et al. |
| 2013/0094610 | A1 | 4/2013 | Ghannouchi et al. |
| 2013/0094612 | A1 | 4/2013 | Kim et al. |
| 2013/0163512 | A1 | 6/2013 | Rexberg et al. |
| 2013/0251065 | A1 | 9/2013 | Bai |
| 2013/0259159 | A1 | 10/2013 | McCallister et al. |
| 2013/0329833 | A1 | 12/2013 | Bai |
| 2014/0038659 | A1 | 2/2014 | Wei et al. |
| 2014/0161159 | A1 | 6/2014 | Black et al. |
| 2014/0161207 | A1 | 6/2014 | Teterwak |
| 2014/0177695 | A1 | 6/2014 | Cha et al. |
| 2014/0187182 | A1 | 7/2014 | Yan et al. |
| 2014/0254716 | A1 | 9/2014 | Zhou et al. |
| 2014/0274105 | A1 | 9/2014 | Wang |
| 2014/0292579 | A1 | 10/2014 | Oh et al. |
| 2014/0347126 | A1 | 11/2014 | Laporte et al. |
| 2015/0043313 | A1 | 2/2015 | Stranczl et al. |
| 2015/0043323 | A1 | 2/2015 | Choi et al. |
| 2015/0043678 | A1 | 2/2015 | Hammi |
| 2015/0049841 | A1 | 2/2015 | Laporte et al. |
| 2015/0061761 | A1 | 3/2015 | Wills et al. |
| 2015/0103952 | A1 | 4/2015 | Wang et al. |
| 2015/0123735 | A1 | 5/2015 | Wimpenny |
| 2015/0124907 | A1 | 5/2015 | Li et al. |
| 2015/0171768 | A1 | 6/2015 | Perreault |
| 2015/0325913 | A1 * | 11/2015 | Vagman ............... H01Q 3/2605 342/368 |
| 2015/0326349 | A1 | 11/2015 | Yang et al. |
| 2015/0333781 | A1 | 11/2015 | Alon et al. |
| 2015/0357975 | A1 | 12/2015 | Avniel et al. |
| 2015/0358039 | A1 | 12/2015 | Xiong et al. |
| 2015/0381216 | A1 | 12/2015 | Shor et al. |
| 2015/0381220 | A1 | 12/2015 | Gal et al. |

(56) References Cited

U.S. PATENT DOCUMENTS

| | | | |
|---|---|---|---|
| 2016/0028433 | A1 | 1/2016 | Ding et al. |
| 2016/0065147 | A1 | 3/2016 | Pratt et al. |
| 2016/0087604 | A1 | 3/2016 | Kim et al. |
| 2016/0094253 | A1 | 3/2016 | Weber et al. |
| 2016/0095110 | A1 | 3/2016 | Li et al. |
| 2016/0100180 | A1 | 4/2016 | Oh |
| 2016/0112222 | A1 | 4/2016 | Pashay-Kojouri et al. |
| 2016/0174118 | A1 | 6/2016 | Duan et al. |
| 2016/0191020 | A1 | 6/2016 | Velazquez |
| 2016/0211577 | A1* | 7/2016 | Miller ................ H01Q 3/24 |
| 2016/0241277 | A1 | 8/2016 | Rexberg et al. |
| 2016/0249300 | A1 | 8/2016 | Tsai et al. |
| 2016/0285485 | A1 | 9/2016 | Fehri et al. |
| 2016/0308577 | A1 | 10/2016 | Molina et al. |
| 2016/0373072 | A1 | 12/2016 | Magesacher et al. |
| 2017/0005627 | A1 | 1/2017 | Zhao et al. |
| 2017/0033969 | A1 | 2/2017 | Yang et al. |
| 2017/0041124 | A1 | 2/2017 | Khandani |
| 2017/0047899 | A1 | 2/2017 | Abdelrahman et al. |
| 2017/0077981 | A1 | 3/2017 | Tobisu et al. |
| 2017/0176507 | A1 | 6/2017 | O'Keeffe et al. |
| 2017/0237455 | A1 | 8/2017 | Ye et al. |
| 2017/0244582 | A1 | 8/2017 | Gal et al. |
| 2017/0302233 | A1 | 10/2017 | Huang |
| 2017/0338841 | A1 | 11/2017 | Pratt |
| 2018/0097530 | A1 | 4/2018 | Yang et al. |
| 2018/0167092 | A1 | 6/2018 | Hausmair et al. |
| 2018/0287569 | A1 | 10/2018 | Ku et al. |
| 2018/0337700 | A1 | 11/2018 | Huang et al. |
| 2019/0007075 | A1 | 1/2019 | Kim et al. |
| 2019/0104000 | A1 | 4/2019 | Xie et al. |
| 2019/0238204 | A1 | 8/2019 | Kim et al. |
| 2019/0260401 | A1 | 8/2019 | Megretski et al. |
| 2019/0260402 | A1 | 8/2019 | Chuang et al. |
| 2019/0348956 | A1 | 11/2019 | Megretski et al. |
| 2019/0363676 | A1 | 11/2019 | Megretski et al. |
| 2019/0363742 | A1 | 11/2019 | Megretski et al. |
| 2020/0028476 | A1 | 1/2020 | Kim et al. |
| 2020/0067543 | A1 | 2/2020 | Kim et al. |

FOREIGN PATENT DOCUMENTS

| | | |
|---|---|---|
| EP | 1732208 A1 | 12/2006 |
| EP | 2991221 A1 | 3/2016 |
| JP | 2005-065211 A | 3/2005 |
| JP | 2010-136123 A | 6/2010 |
| JP | 2013-542696 A | 11/2013 |
| JP | 2014-533017 A | 12/2014 |
| WO | 20120154430 A1 | 11/2012 |
| WO | 2015107392 A1 | 7/2015 |
| WO | 2018156932 A1 | 8/2018 |
| WO | 2018227093 A1 | 12/2018 |
| WO | 2018227111 A1 | 12/2018 |
| WO | 2019/014422 A1 | 1/2019 |
| WO | 2019031714 A1 | 2/2019 |
| WO | 2019070573 A1 | 4/2019 |
| WO | 2019094713 A1 | 5/2019 |
| WO | 2019094720 A1 | 5/2019 |

OTHER PUBLICATIONS

Barradas, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.

Bosch et al. "Measurement and Simulation of Memory Effects in Predistortion Linearizers," IEEE Transactions on Mircrowave Theory and Techniques; vol. 37.No. 12; Dec. 1989, pp. 1885-1890.

Braithwaite, et al. "Closed-Loop Digital Predistortion (DPD) Using an Observation Path with Limited Bandwidth" IEEE Transactions on Microwave Theory and Techniques; vol. 63, No. 2; Feb. 2015, pp. 726-736.

Cavers, "Amplifier Linearization Using a Digital Predistorter with Fast Adaption and Low Memory Requirements;" IEEE Transactions on Vehicular Technology; vol. 39; No. 4; Nov. 1990, pp. 374-382.

D'Andrea et al., "Nonlinear Predistortion of OFDM Signals over Frequency-Selective Fading Channels," IEEE Transactions on Communications; vol. 49; No. 5, May 2001; pp. 837-843.

Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603.

Henrie, et al., "Cancellation of Passive Intermodulation Distortion in Microwave Networks", Proceedings of the 38.sup.th European Microwave Conference, Oct. 2008, Amsterdam, The Netherlands, pp. 1153-1156.

Hong et al., "Weighted Polynomial Digital Predistortion for Low Memory Effect Doherty Power Amplifier," IEEE Transactions on Microwave Theory and Techniques; vol. 55; No. 5, May 2007, pp. 925-931.

Kwan, et al., "Concurrent Multi-Band Envelope Modulated Power Amplifier Linearized Using Extended Phase-Aligned DPD", IEEE Transactions on Microwave Theory and Techniques; vol. 62, No. 12, Dec. 2014, pp. 3298-3308.

Lajoinie et al. Efficient Simulation of NPR for the Optimum Design of Satellite Transponders SSPAs, EEE MTT-S International; vol. 2; Jun. 1998; pp. 741-744.

Li et al. "High-Throughput Signal Component Separator for Asymmetric Multi-Level Outphasing Power Amplifiers," IEEE Journal of Solid-State Circuits; vol. 48; No. 2; Feb. 2013; pp. 369-380.

Liang, et al. "A Quadratic-Interpolated Lut-Based Digital Predistortion Techniques for Cellular Power Amplifiers", IEEE Transactions on Circuits and Systems; II: Express Briefs, vol. 61, No. 3, Mar. 2014; pp. 133-137.

Liu, et al. "Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.

Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.

Morgan, et al. "A Generalized Memory Polynomial Model for Digital Predistortion of RF Power Amplifiers," IEEE Transactions of Signal Processing; vol. 54; No. 10; Oct. 2006; pp. 3852-3860.

Muta et al., "Adaptive predistortion linearization based on orthogonal polynomial expansion for nonlinear power amplifiers in OFDM systems", Communications and Signal Processing (ICCP), International Conference on, IEEE, pp. 512-516, 2011.

Naraharisetti, et a., "2D Cubic Spline Implementation for Concurrent Dual-Band System", IEEE, 2013, pp. 1-4.

Naraharisetti, et al. "Efficient Least-Squares 2-D-Cubic Spline for Concurrent Dual-Band Systems", IEEE Transactions on Microwave Theory and Techniques, vol. 63; No. 7, Jul. 2015; pp. 2199-2210.

Panigada, et al. "A 130 mW 100 MS/s Pipelined ADC with 69 SNDR Enabled by Digital Harmonic Distortion Correction," IEEE Journal of Solid-State Circuits; vol. 44; No. 12; Dec. 2009, pp. 3314-3328.

Peng, et al. "Digital Predistortion for Power Amplifier Based on Sparse Bayesian Learning", IEEE Transactions on Circuits and Systems, II: Express Briefs; 2015, pp. 1-5.

Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61; No. 12, Dec. 2013, pp. 4591-4599.

Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 2010; pp. 95-104.

Safari, et al., "Spline-Based Model for Digital Predistortion of Wide-Band Signals for High Power Amplifier Linearization", IEEE; 2007, pp. 1441-1444.

Sevic, et al. "A Novel Envelope-Termination Load-Pull Method of ACPR Optimization of RF/Microwave Power Amplifiers," IEEE MTT-S International; vol. 2, Jun. 1998; pp. 723-726.

(56) References Cited

OTHER PUBLICATIONS

Tai, "Efficient Watt-Level Power Amplifiers in Deeply Scaled CMOS," Ph.D. Dissertation; Carnegie Mellon University; May 2011; 129 pages.
Tehran, et al. "Modeling of Long Term Memory Effects in RF Power Amplifiers with Dynamic Parameters", IEEE; 2012, pp. 1-3.
Yu et al. "A Generalized Model Based on Canonical Piecewise Linear Functions for Digital Predistortion", Proceedings of the Asia-Pacific Microwave Conference; 2016, pp. 1-4.
Yu, et al. "Band-Limited Volterra Series-Based Digital Predistortion for Wideband RF Power Amplifiers," IEEE Transactions of Microwave Theory and Techniques; vol. 60; No. 12; Dec. 2012, pp. 4198-4208.
Yu, et al."Digital Predistortion Using Adaptive Basis Functions", IEEE Transations on Circuits and Systems-I. Regular Papers; vol. 60, No. 12; Dec. 2013, pp. 3317-3327.
Zhang et al. "Linearity Performance of Outphasing Power Amplifier Systems," Design of Linear Outphasing Power Amplifiers; Google e-book; 2003; Retrieved on Jun. 13, 2014; Retrieved from Internet <URL:http:www.artechhouse.com/uploads/public/documents/chapters/Zhang-LarsonCH- 2.pdf; pp. 35-85.
Zhu et al."Digital Predistortion for Envelope-Tracking Power Amplifiers Using Decomposed Piecewise Volterra Sereis," IEEE Transactions on Microwave Theory and Techniques; vol. 56; No. 10; Oct. 2008; pp. 2237-2247.
Cidronali, A., I. Magrini, R. Fagotti, and G. Manes. "A new approach for concurrent dual-band IF digital predistortion: System design and analysis." In 2008 Workshop on Integrated Nonlinear Microwave and Millimetre-Wave Circuits, pp. 127-130. IEEE, 2008.
Henrie, Justin, Andrew Christianson, and William J. Chappell. "Cancellation of passive intermodulation distortion in microwave networks." In Microwave Conference, 2008. EuMC 2008. 38th European, pp. 1153-1156. IEEE, 2008.
Riihonen et al., "Mitigation of Loopback Self-Interference in Full-Duplex Mimo Relays" IEEE Transactions on Signal Processing, 59(12), 5983-5993, Dec. 2011.
Extended European Search Report dated May 26, 2020 in EP Application No. 17859273.9.

* cited by examiner

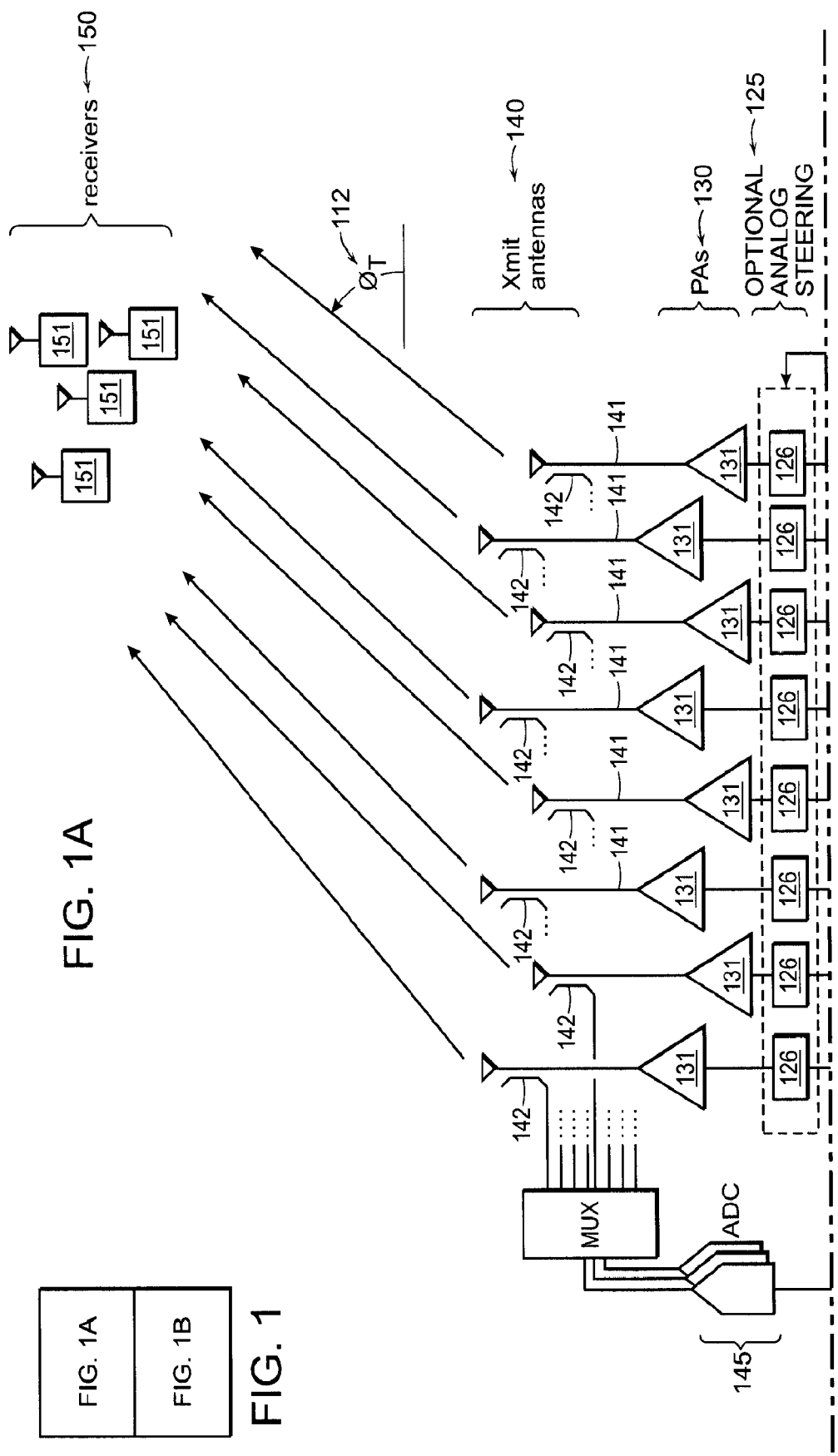

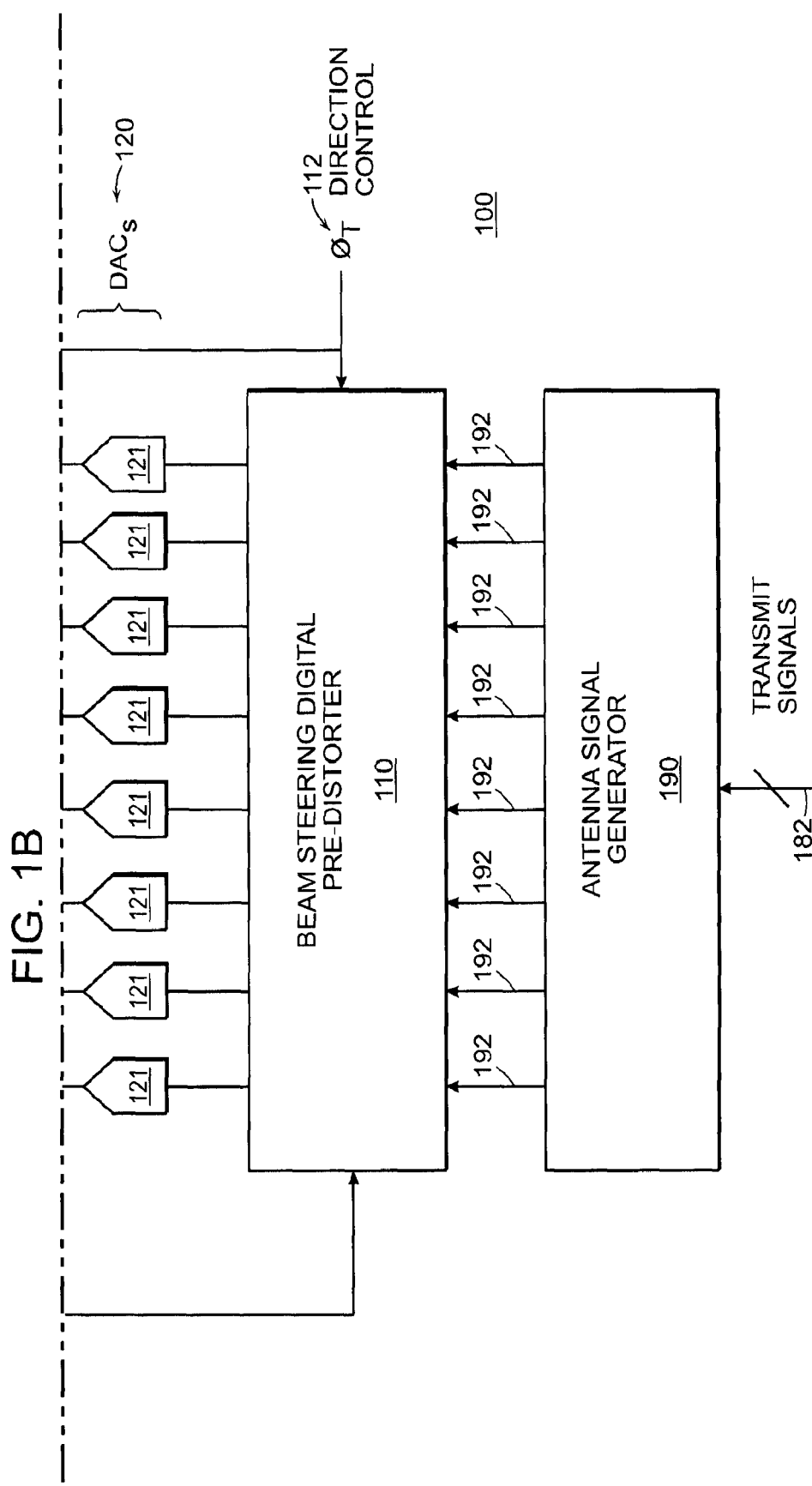

BEAM STEERING DIGITAL PREDISTORTION

CROSS-REFERENCE TO RELATED APPLICATIONS

This application is the national phase under 35 USC 371 of international application no. PCT/US2017/055592, filed Oct. 6, 2017, which claims the benefit of U.S. Provisional Application No. 62/405,329, filed Oct. 7, 2016, the contents of which are incorporated herein by reference.

BACKGROUND

This present disclosure is related to predistortion of signals for beam forming and steering.

A demand for a faster delivery of ever larger data has been accelerating. It in turn demands for an increased capacity for wireless communication systems. Meanwhile, available spectrum for wireless communication is finite.

One of the wireless communication system architectures used to increase capacity is a beamforming array. In a beamforming array, N number of antenna paths forms a directed beam and is pointed toward an intended user. The beamforming array may be an active antenna array, which includes power amplifiers. Although each power amplifier may output 100 mW-1 W, a much lower power level than a typical macro power amplifier, an aggregate output power can be equal or greater than a macro power amplifier. As an example, an array size of 128 can form 16 beams with 8 antennas per beam and thus 16 different users can share the same spectrum simultaneously (in an ideal case).

SUMMARY

In one aspect, in general, an approach to predistortion of a first set of signals for an antenna array allows beam-steering without corrupting spectrum away from the main beam and where other users may be located. In some implementations, a pre-distorter uses fewer than one pre-distorter per signal (i.e., per power amplifier or per antenna), and/or has the computational complexity of such fewer pre-distorters, to generate predistortions of the first set of signals for amplification and transmission via the antenna array.

Aspects may include one or more of the following features.

The first set of N signals (e.g., driving signals, configured to, when processed by an antenna array, drive the antenna array to transmit one or more directional RF signals) is converted to a smaller second set of k signals, e.g., input directional signals (which may correspond to the predicted or intended direction and/or amplitude of the one or more directional RF signals that would ideally be produced by the antenna array as a result of the original driving signals).

A pre-distorter generates a fourth set of signals, namely pre-distorted directional signals, with the same number as the second set of signals (the input directional signals), and the fourth set of signals may be converted to a fifth set of signals (namely, pre-distorted correcting signals), of the same number (N) as the first set of signals (i.e., the input driving signals). A combination of the first set of signals (the original driving signals) and the fifth set of signals (the pre-distorted correcting signals) is used to generate a sixth set of signals, namely corrected driving signals, which represent the pre-distortions of the first set of signals (the input driving signals). For examples, each signal of the fifth set of signals is added to a corresponding different signal of the first set of signals to generate a different signal of the sixth set of signals. The sixth set of signals (the corrected driving signals) are provided for amplification and transmission via the antenna array.

In some embodiments, the configuration of the pre-distorter may be adaptive. In such embodiments, a third set of signals, corresponding to sensed directional signals, of the same number (k) as the second set of signals (the input directional signals), is determined based on sensing of signals driving the antenna array. (Each signal of the third set of sensed directional signals is not necessarily determined concurrently with the other signals of the third set, nor is it necessarily generated continuously.) For example, the set of sensed directional signals is generated using mapping (e.g., the same conversion applied to the first, original, input driving set of signals). Configuration of the pre-distorter may be determined based on the second set (the input directional signals) and the third set of signals (the sensed directional signals), for example being repeatedly determined in an adaptation procedure.

Each signal of the second set of signals (the input directional signals) may correspond to a different beam direction of a set of beam directions. Similarly, each signal of the third set of signals (the sensed directional signals), and each signal of the fourth set of signals corresponds to a different beam direction of the set of beam directions. The size of the set of beam directions is smaller than the size of the first set of input driving signals.

One or more directions of the set of beam directions are determined according to a direction of a main beam of the antenna array (e.g., the direction of the main lobe of an antenna pattern). One or more directions of the set of beam directions are determined according to a direction (e.g., a predicted or measured direction) of a side lobe of a main lobe of an antenna pattern. One or more directions of the set of beam directions are determined according to directions of significant energy transmission. One or more directions of the set of beam directions are determined by scanning (e.g., over all 360 degrees) for spectral emission mask violations (i.e., direction in which spectral energy exceeds a prescribed maximum at a frequency or range of frequencies), and selecting one or more of the directions to correspond to the directions of such violations. In some implementations, the set of beam directions is formed by adding one direction at a time, while in other implementations, the directions are added all at a time. In an approach where the beam directions are added one at a time, the scanning may be repeated after the predistortion based on the previously determined directions.

In some embodiments, the pre-distortions of the first set of signals (the original input driving signals) are further modified prior to transmission from the antenna array (e.g., before or after amplification, before or after digital-to-analog conversion) in order to direct a beam from the antenna array in a controlled direction (e.g., toward a user), and the pre-distorter compensates for this modification in generating the predistortions of the first set of signals.

In some variations, a method for signal predistortion is provided that includes receiving a plurality of input driving signals (401) for driving an antenna array (140), and converting the plurality of input driving signals (401) to a plurality of input directional signals (402) having fewer signals than the plurality of input driving signals, with each of the plurality of input directional signals being associated with a respective direction of a plurality of directions of emission from the antenna array. The method further includes processing the plurality of input directional signals (402) to form a plurality of directional predistortion signals (404), with each of the plurality of directional predistortion signals being associated with a respective one of the plurality of input directional signals, using the plurality of directional predistortion signals to predistort the plurality of input driving signals to yield a plurality of predistorted driving signals (406), and providing the plurality of predistorted driving signals for driving the antenna array.

Embodiments of the method may include at least some of the features described in the present disclosure, including one or more of the following features.

The method may further include determining a plurality of sensed directional signals (403), of the same number of signals as the plurality of input directional signals (402), and using at least the plurality of sensed directional signals to determine values of predistortion configuration parameters. The predistortion configuration parameters may be used to process the plurality of input directional signals (402) to form the plurality of directional predistortion signals (404).

Using at least the plurality of sensed directional signals (403) to determine the values of the predistortion configuration parameters may include performing one or more of, for example, optimization of the predistortion configuration parameters based on one or more objective functions computed according to at least the plurality of sensed directional signals, and/or selection of one or more pre-determined sets of predistortion coefficients based on a criterion computed according to the at least the plurality of sensed directional signals.

The method may further include further using the plurality of input directional signals (402) to determine the values of the predistortion configuration parameters.

Using the directional predistortion signals to predistort the input driving signals to yield the plurality of predistorted driving signals may include converting the directional predistortion signals (404) to a plurality of correcting predistortion signals (405) of the same number of signals as the input driving signals (401), and combining respective ones of the plurality of input driving signals and the plurality of correcting predistortion signals to generate the plurality of predistorted driving signals (406).

Converting the plurality of input driving signals to the plurality of input directional signals may include mapping the plurality of input driving signals (401) to the plurality of input directional signals (402) according to a mapping function. Converting the plurality of directional predistortion signals (404) to the plurality of correcting predistortion signals may include mapping the plurality of directional predistortion signals (404) to the plurality of correcting predistortion signals (405) according to an inverse function of the mapping function.

The method may further include determining the plurality of directions of emission. Converting the plurality of input driving signals (401) to the plurality of input directional signals (402) may be performed according to the determined plurality of directions of emission.

Driving the antenna array with the plurality of predistorted driving signals may be performed to emit a directional beam from the antenna array in a beam direction, with the plurality of directions of emissions being determined from the beam direction.

The plurality of input directional signals may be representative of respective signal strengths in a plurality of desired transmission directions.

The antenna array may include one or more power amplifiers with respective associated non-linear behavior, and using the plurality of input directional signals (402) to form the plurality of directional predistortion signals may include pre-distorting the plurality of input directional signals according to adjustable predistortion configuration parameters to generate the plurality of directional predistortion signals (404) that, when converted to the plurality of correcting predistortion signals (405) and combined with the plurality of input driving signals (401) to yield and provide the plurality of predistorted driving signals cause a reduction in spectrum leakage resulting from the non-linear behavior of the power amplifiers.

In some variations, a beam-steering pre-distorter system is provided that includes a first mapper configured to accept a plurality of input driving signals (401) to drive an antenna array and provide a plurality of input directional signals (402) having fewer signals than the plurality of input driving signals, with each of the plurality of input directional signals being associated with a respective direction of a plurality of directions of emission from the antenna array. The beam-steering pre-distorter system further includes a pre-distorter configured to process the plurality of input directional signals (402) to form a plurality of directional predistortion signals (404), with each of the plurality of directional predistortion signals being associated with a respective one of the plurality of input directional signals, and a filtering unit configured to use the plurality of directional predistortion signals to predistort the plurality of input driving signals (401) to yield a plurality of predistorted driving signals (406), and provide the plurality of predistorted driving signals to drive the antenna array.

Embodiments of the beam-steering pre-distorter system may include at least some of the features described in the present disclosure, including at least some of the features described above in relation to the method, as well as one or more of the following features.

The beam-steering pre-distorter system may further include a beam-steering converter (424) configured to determine a plurality of sensed directional signals (403), of the same number of signals as the plurality of input directional signals (402), and a digital predistorter (DPD) adaptation component configured to use at least the plurality of sensed directional signals (403) to determine values of predistortion configuration parameters. The predistortion configuration parameters may be used to process the plurality of input directional signals (402) to form the plurality of directional predistortion signals (404).

The DPD adaptation component configured to use the plurality of sensed directional signals to determine the value of the predistortion configuration parameters may be configured to perform one or more of, for example, optimization of the predistortion configuration parameters based on one or more objective functions computed according to at least the plurality of sensed directional signals, and/or selection of one or more pre-determined sets of predistortion coefficients based on a criterion computed according to the at least the plurality of sensed directional signals.

The DPD adaptation component may further be configured to further use the plurality of input directional signals (402) to determine the values of the predistortion configuration parameters.

The filtering unit configured to use the directional predistortion signals to predistort the input driving signals to yield the plurality of predistorted driving signals may include a beam-steering converter (426) to convert the directional predistortion signals (404) to a plurality of correcting predistortion signals (405) of the same number of signals as the input driving signals (401), and a signal combiner to combine respective ones of the plurality of input driving signals and the plurality of correcting predistortion signals to generate the plurality of predistorted driving signals (406).

The first mapper configured to provide the plurality of input directional signals may be configured to map the plurality of input driving signals (401) to the plurality of input directional signals (402) according to a mapping function. The beam-steering converter (426) may be configured to map the plurality of directional predistortion signals (404) to the plurality of correcting predistortion signals (405) according to an inverse function of the mapping function.

The beam-steering pre-distorter system may further include a beam direction controller to determine the plurality of directions of emission. The first mapper may be configured to convert the plurality of input driving signals (401) to the plurality of input directional signals (402) according to the determined plurality of directions of emission.

The antenna array may include one or more power amplifiers with respective associated non-linear behavior. The pre-distorter configured to process the plurality of input directional signals to form the plurality of directional predistortion signals may be configured to pre-distort the plurality of input directional signals according to adjustable predistortion configuration parameters to generate the plurality of directional predistortion signals (404) that, when converted to the plurality of correcting predistortion signals (405), and combined with the plurality of input driving signals (401) to provide the plurality of predistorted driving signals (406), cause a reduction in spectrum leakage resulting from the non-linear behavior of the power amplifiers.

In some variations, a predistorter is provider that is configured to perform one or more of the method steps provided above.

In some variations, a design structure is provided that is encoded on a non-transitory machine-readable medium, with the design structure including elements that, when processed, generate one or more of the beam-steering pre-distorter system modules described above, or the pre-distorter described above.

In some variations, a non-transitory computer readable media is provided that is programmed with a set of computer instructions executable on a processor that, when executed, cause the operations comprising the various method steps described above.

Other features and advantages of the invention are apparent from the following description, and from the claims.

DESCRIPTION OF DRAWINGS

These and other aspects will now be described in detail with reference to the following drawings.

FIG. 1 is block diagram of a system that includes a beam steering digital pre-distorter.

Like reference symbols in the various drawings indicate like elements.

DESCRIPTION

Figure 2:
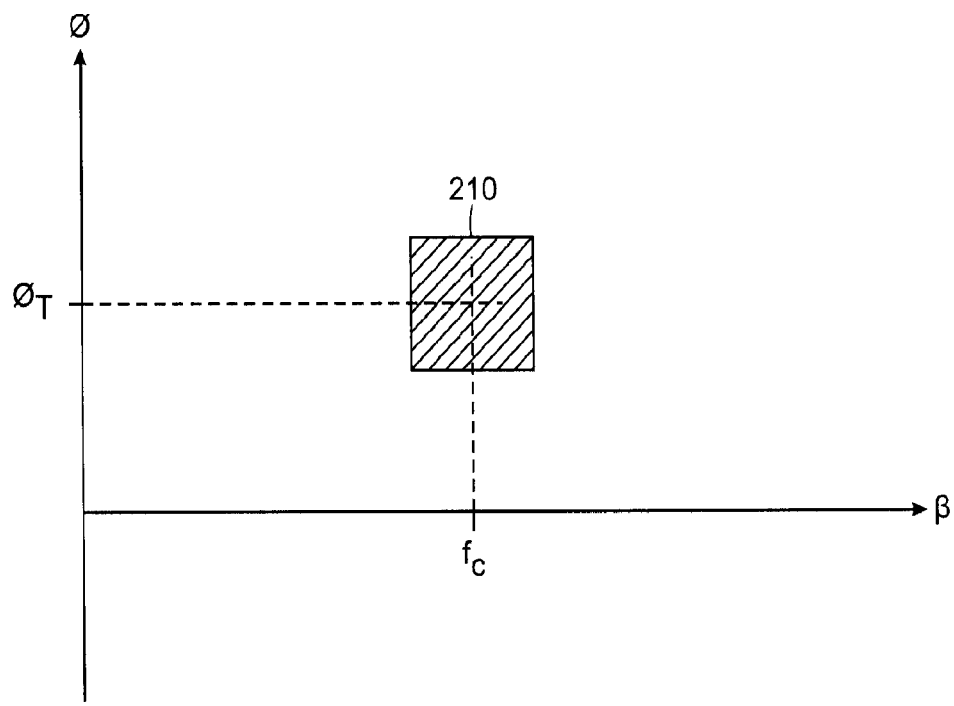
FIG. 2 is a graph showing a compact region of direction versus frequency space.

In typical macro or micro base stations, where the output power of a power amplifier is >5 W, a linearization technique such as digital pre-distortion (DPD) or analog pre-distortion is implemented to reduce the spectral leakage from nonlinear distortions introduced by the power amplifier(s) or other components. Otherwise, the power amplifiers must operate in a linear region and compromise its power efficiency. The power amplifier operating at a backed-off power level may have a power efficiency of 10-20% while the more nonlinear power amplifier may have a power efficiency of 35-50%.

One approach to DPD can be implemented for each power amplifier to operate with higher power efficiency. But now the system must implement N number of DPDs for N×N beamforming array with N amplifiers and antennas. When N of 64 or larger (which is typical for a beamforming array), power amplifiers may be configured to operate in a linear and less power efficient region because the complexity of implementing a large number of DPDs is too great.

Although a single DPD for an N-element beamforming array may be desirable, it may not be sufficient to optimize the coefficients of the DPD for the benefit of one or more users in the direction of the directed beam. For example, such an approach may corrupt the spectrum for other users in other directions being serviced, for example, by other directed beams.

Thus, disclosed herein are methods, systems, apparatus, devices, media, and other implementations, including a method for signal predistortion that includes receiving a plurality of input driving signals (the first signals) for driving an antenna array, and converting the plurality of input signals to a plurality of input directional signals (the second signals) having fewer signals than the plurality of input driving signals, with each of the plurality of input directional signals being associated with a respective direction of a plurality of directions of emission from the antenna array. The method further includes processing the plurality of input directional signals to form a plurality of directional predistortion signals (fourth signals), with each of the plurality of directional predistortion signals being associated with a respective one of the plurality of input directional signals, using the plurality of directional predistortion signals to predistort the plurality input driving signals to yield a plurality of predistorted driving signals (the sixth signals), and providing the plurality of predistorted driving signals for driving the antenna array.

In some embodiments, the implementations described herein are configured to be adaptive, so that output signals produced by the systems (e.g., the antenna array output) can be sensed and used to adjust predistortion processing performed by the systems. Thus, in such embodiments, the method may further include determining a plurality of sensed directional signals (the third signals), of the same number of signals as the plurality of input directional signals (the second signals), and using at least the plurality of sensed directional signals to determine values of predistortion configuration parameters. The predistortion configuration parameters may be used to process the plurality of input directional signals to form the plurality of directional predistortion signals. Alternatively, in some embodiments, the predistortion processing may be based on a lookup table (or database) using, for example, operating conditions instead of implementing feedback adaption.

In some embodiments, using the directional predistortion signals to predistort the input driving signals to yield the plurality of predistorted driving signals may include converting the directional predistortion signals to a plurality of correcting predistortion signals (the fifth signals) of the same number of signals as the input driving signals, and combining respective ones of the plurality of input driving signals and the plurality of correcting predistortion signals to generate the plurality of predistorted driving signals.

Referring to FIG. 1, a transmission system 100 includes an antenna array 140 with a set of N antennas 141 (in the illustrated case N=8 antennas). In the illustrated system, each antenna 141 is driven by a corresponding power amplifier 131. Digital baseband signals for the antennas are fed to a set of digital-to-analog Converters (DACs) 120 with each DAC 121 of the set driving a corresponding power amplifier 131. A first set of signals including signals 192 (the input driving signals) are generated by an antenna signal generator 190, with each signal 192 corresponding to a different DAC 121. Absent non-linear characteristics of the signal chain from the signal generator 190 to the antenna array 140 (which may include the power amplifiers 131), the signals 192 may be suitable for directly driving the DACs 121. However, in order to compensate for non-linear characteristics, a beam-steering pre-distorter 110 is used to modify ("predistort") the signals 192.

As illustrated in FIG. 1, the signals driving the antenna array form a directional beam, generally to communicate with a set of one or more receivers 151 (e.g., a mobile device (such as a mobile phone) a network node, or any other wireless device) in a particular direction from the antenna array. In some implementations, an analog beam steering section 125 includes one or more phase modification elements 126 (optionally also modifying gain) on the signal path to each antenna. In other implementations, the signal generator 190 may determine the signals 192 to form the directional beam, and therefore the analog steering section may not be necessary.

In any case, the predistorter 110 may make use of a controlled direction 112 in determining its configuration. In other implementations, the predistorter 110 may not be adaptable, or may be adaptable based on factors/conditions other than directions determined by the direction controller. Where the predistorter 110 is adaptable and can be adjusted based on the output of the non-linear system, the signals driving the antennas are sensed, for example at a coupler 142 at each antenna, and some or all are digitized (and downconverted from RF), for example, using an analog multiplexer and one or more analog-to-digital Converters (ADCs).

Figure 3:
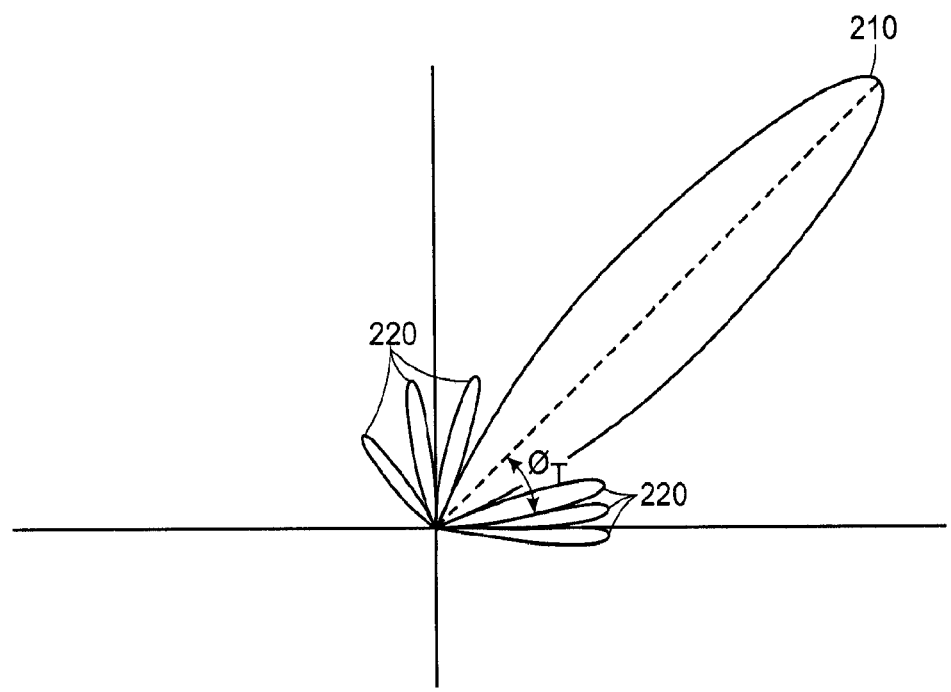
FIG. 3 is a diagram of an antenna gain pattern.

Referring to FIG. 2, in some implementations, there is a range of frequencies and a range of directions, represented as a region 210 of a direction-frequency space, in which the signal is desired to be delivered with high fidelity (i.e., as a linear combination of the signals 192 that are provided for the antennas), while outside that direction-frequency region 210, to the extent possible, as low spectral energy as possible, or as least spectral energy below a prescribed threshold, is desired. In general, the predistorter 110 of FIG. 1 aims to achieve these dual goals. With reference to FIG. 3, in general, an antenna pattern (i.e., a plot of equal gain as a function of direction) has a main lobe 310, and a set of side lobes 320. In general, in some embodiments, the predistorter 110 aims to keep the spectral energy of side lobes below prescribed thresholds.

Figure 4:
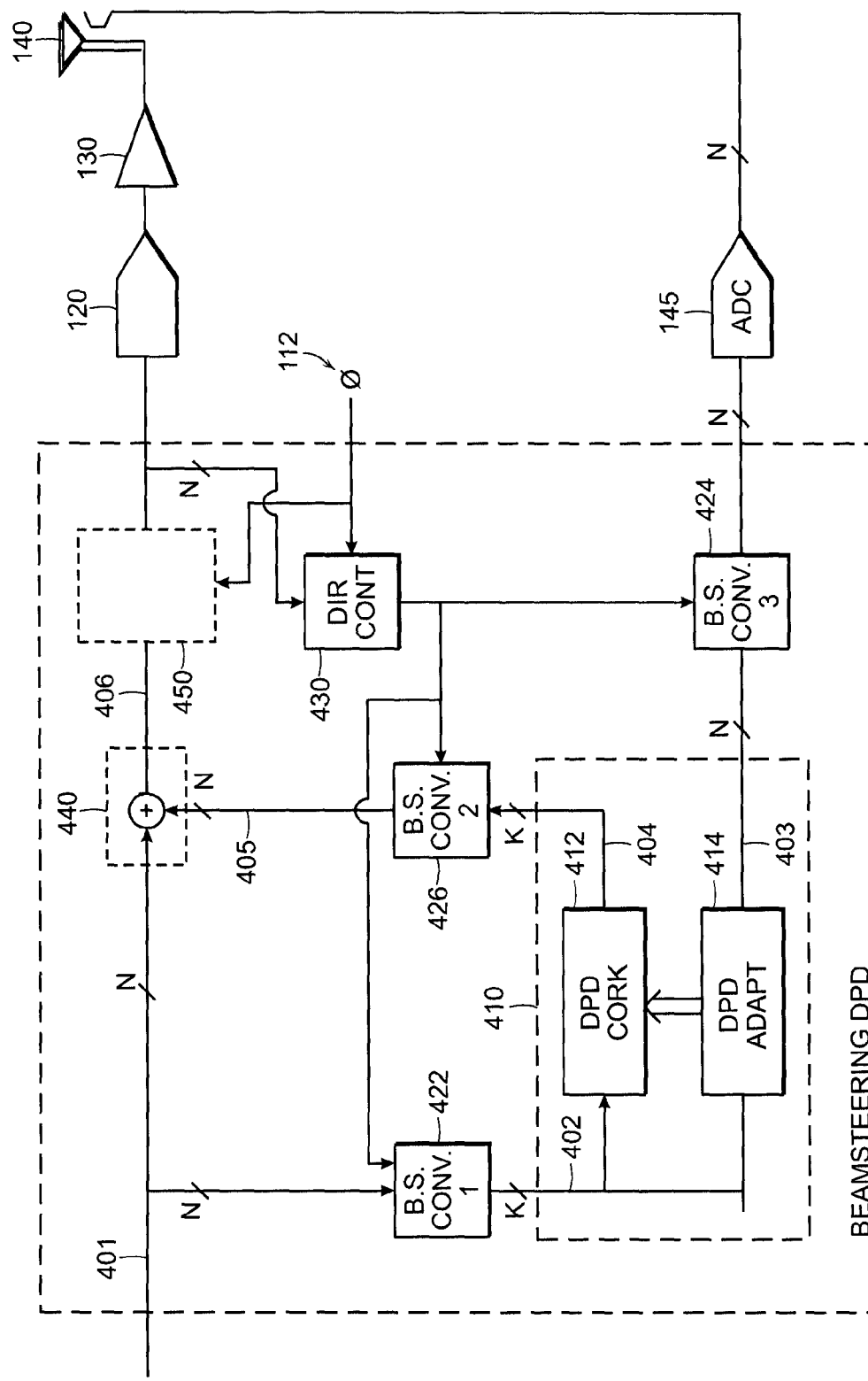
FIG. 4 is a block diagram including components of a beam-steering digital pre-distorter.

With reference next to FIG. 4, an implementation of a beam-steering digital predistorter 110 is configured to accept a set (the first set) of input driving signals 401 (such as the N signals 192 shown in FIG. 1) configured to drive an antenna array. A beam-steering converter 422, also referred to as a direction identification unit, is configured (e.g., according to a rectangular complex matrix L) to convert/reduce this set of input driving signals to form a smaller set of input directional signals 402. (such smaller set comprises k signals, with k<N). Each of the plurality of input directional signals may be associated with a respective direction of a plurality of directions of emission from the antenna array. In some embodiments, the set of input directional signals 402 may be generated through a mapping or transformation procedure (e.g., processor-based procedure, or a hardware filter implementation) that derives, based on the input driving signals 401 (e.g., which may be digital signals), values representative of magnitudes and directions for complex time signals. These values may correspond to expected or predicted magnitude and direction values of, for example, RF transmissions via the antennas (such as the antennas 140 of the antenna array depicted in FIG. 1) assuming ideal (or near ideal) operation of the array. However, as noted, the components of antenna arrays (including filtering or processing modules coupled to antenna arrays), such as the power amplifiers 130 (depicted in both FIG. 1 and FIG. 4), generally exhibit non-linear behavior, at least in some range of their operation. Consequently, actual directional transmission characteristics (e.g., direction of the main lobe of a beam-formed signals, size of side lobes, etc.) may vary from the expected/predicted behavior.

Accordingly, to mitigate variations from the predicted behavior, pre-distortion DPD core 412 is configured to perform predistortion processing filtering on the converted, smaller, set of input directional signals. In some embodiments, the predistortion implemented by the DPD core 412 may use a DPD adaptation component 414 which receives a set (third set) of sensed directional signals 403 from the antennas 140 of the antenna array via an ADC, such as the ADC 145 depicted in both FIGS. 1 and 4, and a beam-steering converter 424. The beam-steering converter 424 may be similar, in configuration and functionality, to the beam-steering converter 422, and in some embodiments, the reduction conversion operations to reduce a set of N sensed signals to k directional signals may be performed by a single common module (which may be included within the DPD core 412 and/or other modules of the beam-steering system depicted in FIGS. 1 and 4).

The DPD core 412 determines correction terms as a set (fourth set) of directional predistortion signals 404, with the set of directional predistortion signals also comprising the same number, k, of signals as the input directional signals or the sensed directional signals. As noted, the DPD adaptation component (processor) 414 is configured to adjustably control the filtering/processing operations performed by the DPD core 412 (e.g., to adjust predistortion configuration parameters that are used to control the predistortion processing). For example, the DPD core may be implemented, in some embodiments, using DPD coefficients (which may be representative of parameters of a function, such as a polynomial, applied to the input signals to the beam-steering system depicted in FIGS. 1 and 4). In such embodiments, the coefficients used by the DPD core 412 may be computed (or adjusted) by determining an updated set of coefficients such that when the function corresponding to those parameters is applied to the input signal (e.g., the input directional signals, in this example) the resultant signal is as close as possible (e.g., in a least mean squared error sense) to the output signal (in this case the sensed directional signals 403, derived from the sensed output at the antennas 140 of the antenna array).

In some embodiments, the DPD adaptation component (processor) 414 may be configured to adjustably control the filtering/processing operations performed by the DPD core 412 using a lookup table or database of predistortion configuration parameters (coefficients), which may be selected, at least in part, based on sensed directional signals and/or input directional signal values (the third and second sets of signals in the example described herein). Alternatively or additionally, adjustment/determination of predistortion configuration parameters (such as DPD coefficients) may be based on such information as system characteristics (including environment variables, "signature" data representative of substantially invariant characteristics of the system, etc.) without using feedback information from an output of the system. The predistortion parameters in a database of coefficients may have been previously determined to achieve some desired associated distortion measures/metrics that characterize the effects of the preprocessing, including an error vector magnitude, or EVM (defined as the square root of the mean error power divided by the square of the maximum constellation magnitude), or other types of distortion measures/metrics. In addition, in some embodiments, a predistortion parameter interpolator may be used to access the database, e.g., using some mapping function based on the predicted and/or sensed directional signals, and determine an interpolated output corresponding to the predistortion parameters selected. Further details regarding the determination of predistortion parameters (e.g., using a database) are provided, for example, in U.S. Pat. No. 9,590,668, entitled "Digital Compensator," the content of which is hereby incorporated by reference in its entirety. Other techniques or procedures to adaptively configure the adjustable DPD core implementations (whether they use adjustable filters, adjustable coefficients representative of processing functions, etc), including through incremental changes to adjustable control input of the DPD core 412, may also be used.

With continued reference to FIG. 4, having performed predistortion processing (e.g., digital predistortion processing, or DPD) on the input directional signals to produce directional predistortion signals (the $4^{th}$ set of signals, marked in FIG. 4 as the signals 404), a beam-steering converter 426 is applied to the pre-distorted directional signals to produce a set (the fifth set) of correcting predistortion signals 405, which are used as correction signals for the input set (first) driving signals. The correcting predistortion signals can be combined (e.g., added) to the set of input driving signals 401 to produce the set (sixth set) of predistorted driving signals 406 (also referred to as corrected predistortion signals). In some implementations, the conversion of the input driving signals to the input directional signals (the second signals 402) may be performed (e.g., using the beam-steering converter, L, 422) by mapping the plurality of input driving signals to the plurality of input directional signals according to a mapping function, e.g., to derive expected directions and signal strengths, or some representation thereof, based on the input driving signals. In such implementations, converting the pre-distorted directional signals to the plurality of correcting predistortion signals may include mapping the plurality of directional predistortion signals, e.g., by the inverting beam-steering converter 426, to the pre-distorted correcting signals according to an inverse function of the mapping function used by the beam-steering converter 422 (the beam-steering converter 426 may be implemented, for example, as a pseudo-inverse $L^+$ of the matrix L).

Optionally, in some embodiments, the correcting predistortion signals 405 may further be modified using a direction controller 430 according, for example, to the controlled direction 112 (of FIG. 1) for forming a beam in the desired direction (e.g., modifying the phases of the signals appropriately). The direction controller 430 may be configured to determine the configurations of the beam-steering converters 422, 424, and 426. In some examples, the direction controller configures the beam-steering converters so that each signal in the second set 402 (the input directional signals), and optionally the third set of signals 403 (the sensed directional signals) corresponds to a particular propagation direction (a beam direction) from the antennas 140 of the antenna array. The direction controller 430 may thus determine a set of beam directions by scanning (e.g., over all 360 degrees) for spectral emission mask violations (i.e., directions in which spectral energy exceeds a prescribed maximum at a frequency or range of frequencies), and selecting one or more of the directions to correspond to the directions of such violations. In some implementations, the set of beam directions is formed by adding one direction at a time, while in other implementations, the directions are added all at a time. In an approach where the beam directions are added one at a time, the scanning may be repeated after the predistortion based on the previously determined directions. In FIG. 4, the DPD core 412 and the DPD adaptation component 414 may operate as a conventional k-dimensional DPD, without necessarily having any aspects that depend on the beam directions or the steering to or from the sets of N signals.

Figure 5A:
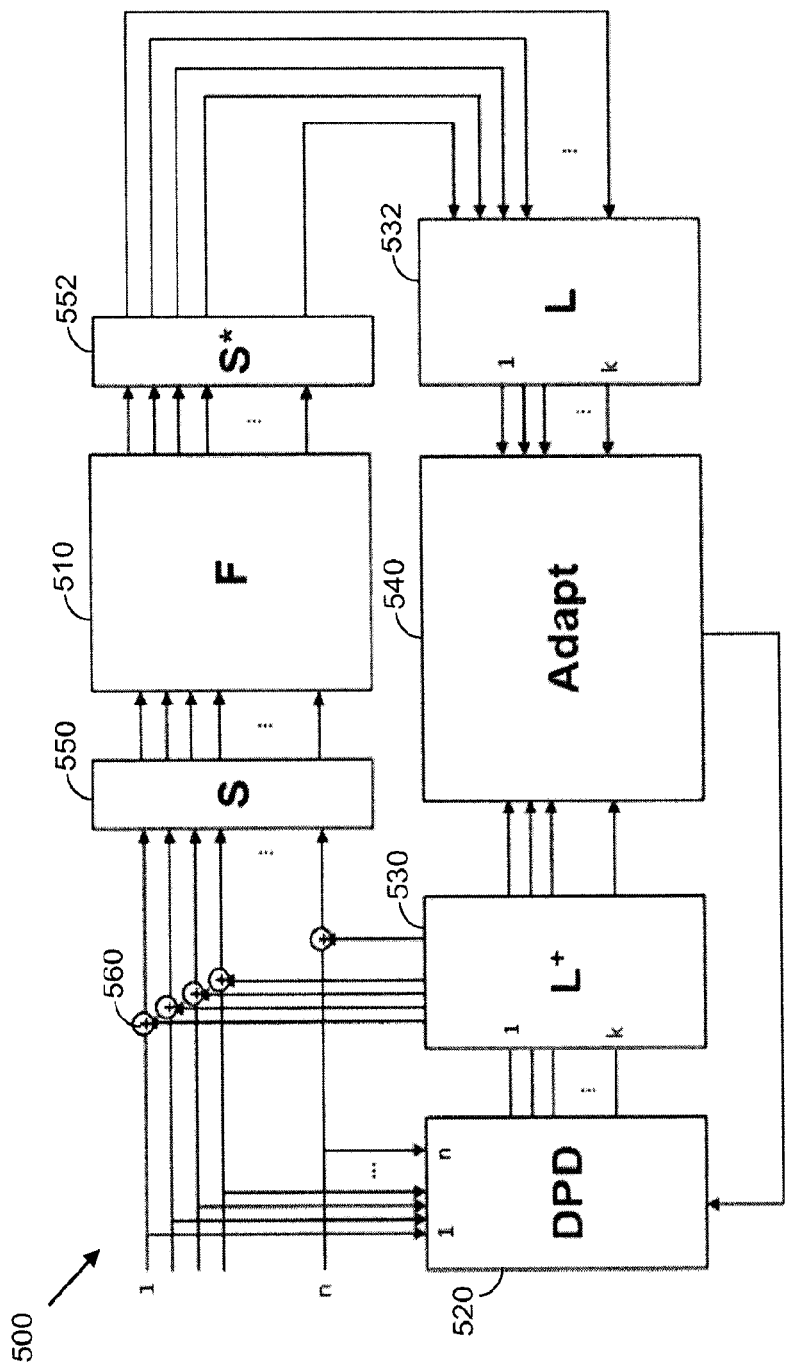
FIG. 5A is a block diagram of a mathematical model for a pre-distortion beamforming system.
Figure 5B:
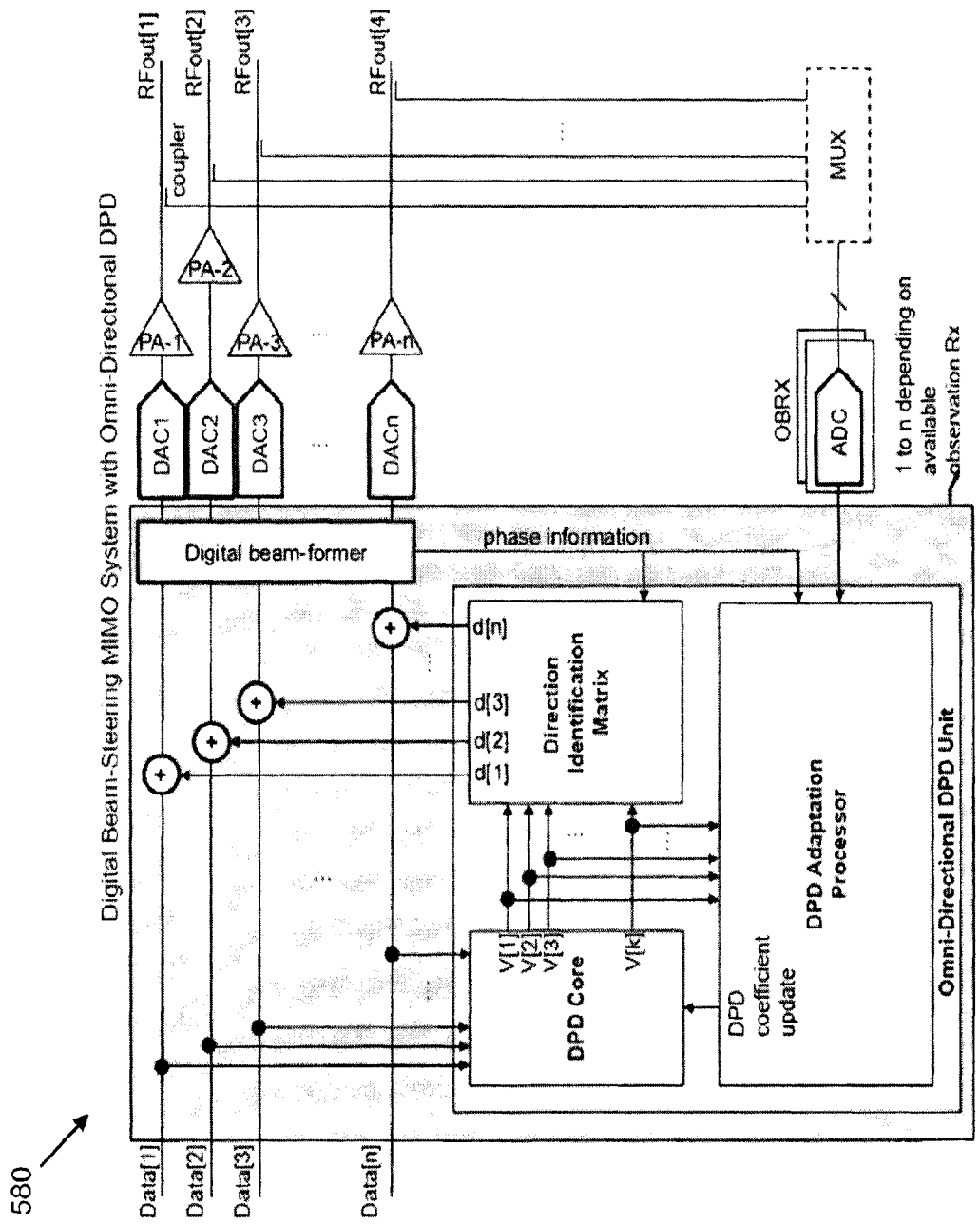
FIGS. 5B-C are schematic diagrams illustrating example implementations of systems similar to the system of FIG. 5A.
Figure 5C:
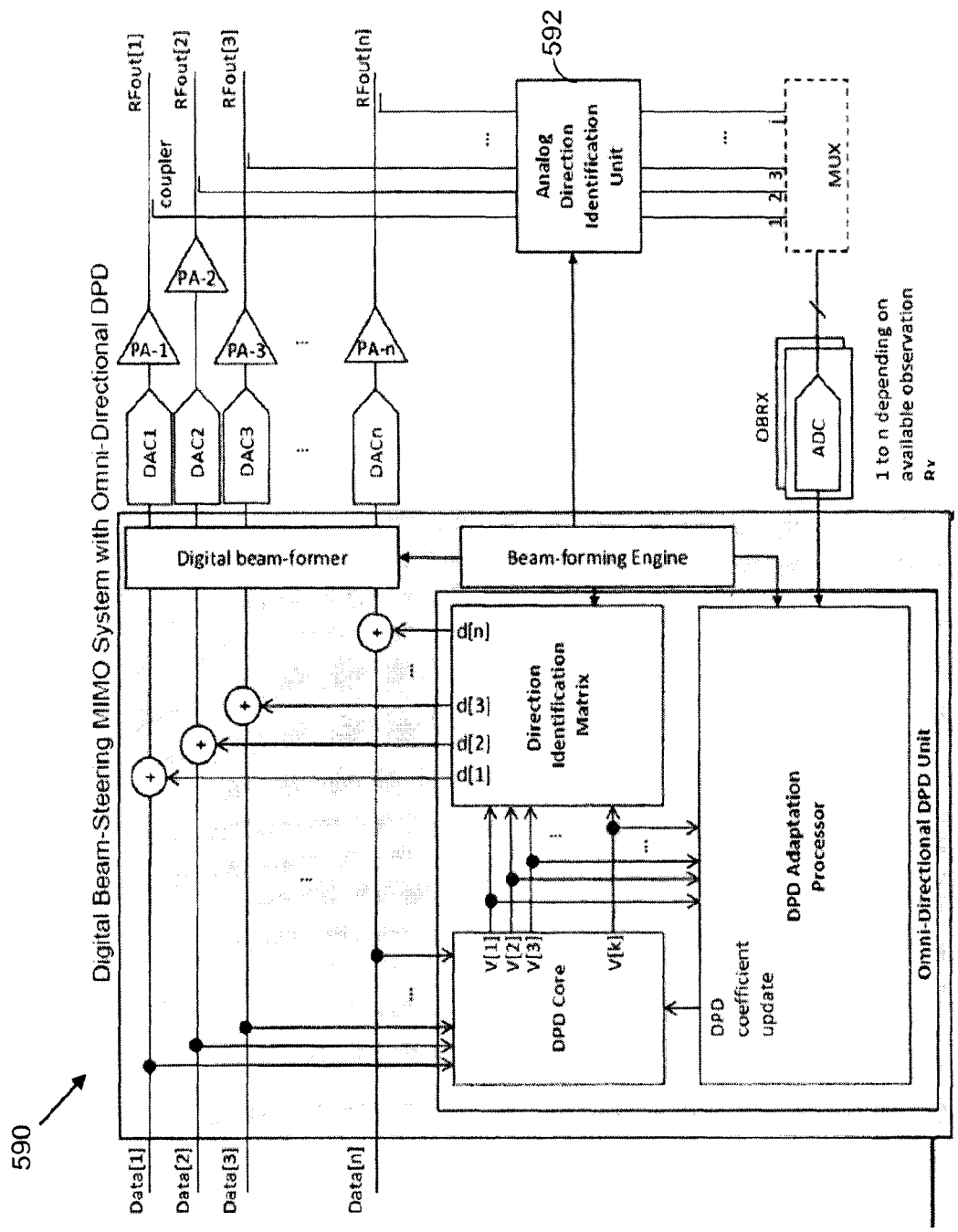

FIG. 5A is a block diagram of a mathematical model for a pre-distortion beamforming system 500, which may be implemented similarly (in configuration or functionality), at least partly, to the systems depicted in FIGS. 1 and 4. Briefly, the system 500 has N digital signal paths and N PA's (although, in some embodiments, the number of PA's and/or other steering components, may be different from N). A DPD core 520 generates k digital signals, where k<N, and a direction identification matrix 530 converts k digital signals generated by the DPD core 520 to N digital signals for the N PAs, Outputs of individual PA's may be available to a DPD adaptation processor 540, and the phase information from the beam-former may be communicated to the adaptation processor 540. The number of required observation receiver (OBRx) can be 1 to N. In the case of 1, OBRx, the adaptation processor may process the individual PA information sequentially and update the DPD coefficient after all PA outputs are processed. The adaptation processor 540 may be configured to use the information derived based on the direction identification matrix 532 to estimate the adjacent channel leakage at multiple directions, and to adjustably control the predistortion parameters of the DPD core 520 to predistort the signals operated on (in this example, the k input directional signals converted from the N input driving signals) that will result in a substantially clean spectrum at observation angles (a pre-determined set of observation angles may be selected at some earlier time). As noted, in some embodiments, the adaptation processor 540 may be configured to control the predistortion parameters of the DPD core 520 based on other factors, variables, and quantities. In some embodiments, the adaptation processor 540 may be excluded (i.e., the DPD core's predistortion parameters may not be dependent on output of the non-linear system). FIGS. 5B and 5C are further schematic illustrations of example pre-distortion beam-steering systems 580 and 590, that are similar to the implementation of the system 500 shown in FIG. 5A. The system 580 of FIG. 5B is realized without a direction identification unit (matrix), while the system 590 of FIG. 5C includes an analog direction identification unit 592.

More particularly, and with continued reference to FIG. 5A, the system 500 includes a non-linear system 510 (marked as module F) which may include a beam steering device (comprising or constituting an antenna array) including, for example, one or more DAC's (such as the DAC's 121 of FIG. 1), coupled to one or more power amplifiers (such as the power amplifiers, PA's 130 of FIG. 1), coupled to one or more antennas (such as the antennas 140). In embodiments in which the non-linear system 510 is a beam steering system, driving signals (whose phase, frequency, and magnitude can be controlled) are combined by the array of DAC's, PA's, and the array of antennas to result in one or more beamformed RF transmissions. The non-linear behavior of any of the components constituting the non-linear system can result in beam-formed transmissions that deviate from the ideal, desired, or predicted directional RF transmissions. For example, as discussed herein, each of the PA's may have individual unique non-linear behavior that results in generation of harmonics, intermodulation distortion of the input signals, and other non-linear distortions, thus resulting in spectral deviations from the desired beam-steered RF emissions.

To mitigate the non-linear distortions of the non-linear system 510, a DPD unit 520, which may be similar to the 412 of FIG. 4, pre-distorts a converted set of signals that were mapped from N driving signals (such as the signals 401 of FIG. 4) into k input directional signals (where k<N) using, for example, a beam-steering converter (not shown in FIG. 5A). The DPD unit 520 is controlled by the adaptation processor 540 (which may be similar to the DPD adapt 414 of FIG. 4), which, as discussed above, may be configured to derive and adjust the pre-distortion filtering function of the DPD core 520 (the DPD core may be implemented using IIR or FIR filters, a DSP-processor-based implementation using functions represented by adjustable coefficients, etc.) The adaptation processor 540 may be configured to determine the adaptation of the DPD functionality of the DPD 520 based, at least in part, a set of sensed signals from the output of the non-linear system. As also illustrated, the output signals from the system 510 (which may have first been processed by a channel calibration system comprising an output calibration unit 552. (S*) and input calibration unit 550 (S)) are converted to a set of k actual directional signals using a direction identification matrix 532 (L). The direction identification matrix may be similar, in configuration and/or functionality, to the beam-steering converter 424 (and/or the beam-steering converter 422). Thus, the adaptation processor 540 may use the senses directional signals, provided by the direction identification matrix 532, and possibly the input directional signals (which may have been determined using another direction matrix implemented, for example, within the DPD core 520), to cause adjustment of the pre-distortion functionality of the DPD core 520 so that upon pre-distortion of the converted set of signals from the input driving signals, their subsequent conversion to N correcting signals, and their combining with the original input driving signals, a beam-steering (beam-formed) pattern will result that closely (or substantially) matches the expected or desired beam-steering pattern.

As also shown in FIG. 5A, an inverting direction identification matrix (beam-steering converter) 530 ($L^+$) is configured to receive the pre-distorted directional signals produced by the DPD 520, and convert the pre-distortion unit into N signals that can then be combined (e.g., using adders such as an adder 560) with the input driving signals. The inverting direction identification matrix 530 implements an inverse mapping function to the mapping function used to convert the N original driving signals into k input directional signals.

Figure 6:
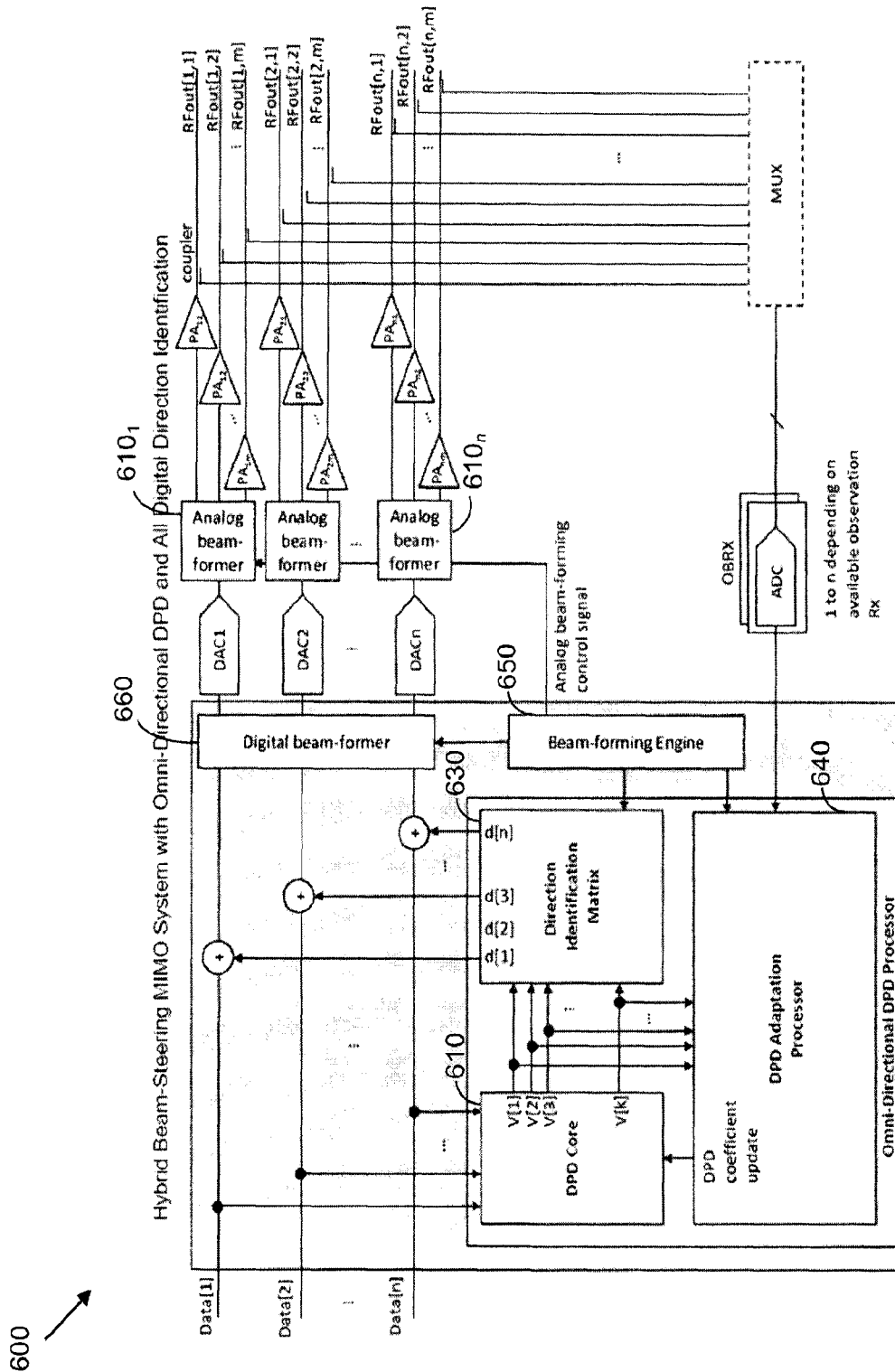
FIG. 6 is a schematic diagram of another example of a digital pre-distortion beam-steering system.

With reference now to FIG. 6, a schematic diagram is provided of another example pre-distortion beam-steering system 600, which generally is similar in its configuration and functionality to the systems 100, 400, and 500 of FIGS. 1, 4, and 5A. In this example implementation, the system 600 includes n digital signal paths, with each digital signal path coupled to a corresponding analog beamformer $610_{1-n}$ that controls an PA's (hence, there are n×m PA's in the example system 600). A DPD core 620, which may be similar to any of the DPD cores 110, 412, or 520 of FIG. 1, 4, or 5A, generates k digital signals, where k<n×m. A direction identification matrix 630 (which may be similar to the beam-steering converter, or matrices, 426 or 530 of FIGS. 4 and 5A, respectively) converts k digital signals generated by the DPD core 620 to n digital signals for n beam formers. Thus, in this example implementation, the predistortion operations performed by the DPD core 620 are configured to mitigate the combined non-linearity, effects for in PA's in each of then paths. The number of required observation receiver (OBRx) could be anywhere from 1 to n×m. In the case of one (1) OBRx, an adaptation processor 640 (which may be similar to adaptation component 414 of FIG. 4 or the adaptation processor 540 of FIG. 5A) processes the individual PA information sequentially and updates the DPD predistortion parameters (e.g., DPD coefficient) after all PA outputs are processed. A beam-forming engine 650 is configured to produce the proper digital phase information for a digital beam former, and to generate the relative control signals for the analog beam formers $610_{1-n}$. Both the digital and analog phase information may be communicated to the DPD adaptation processor 640. The DPD adaptation processor 640 may, in some embodiments, maintain a replica of the direction identification matrix, and use the matrix to estimate the adjacent channel leakage at multiple directions. The DPD system 600 can thus produce a clean spectrum at the various observation angles.

Figure 7:
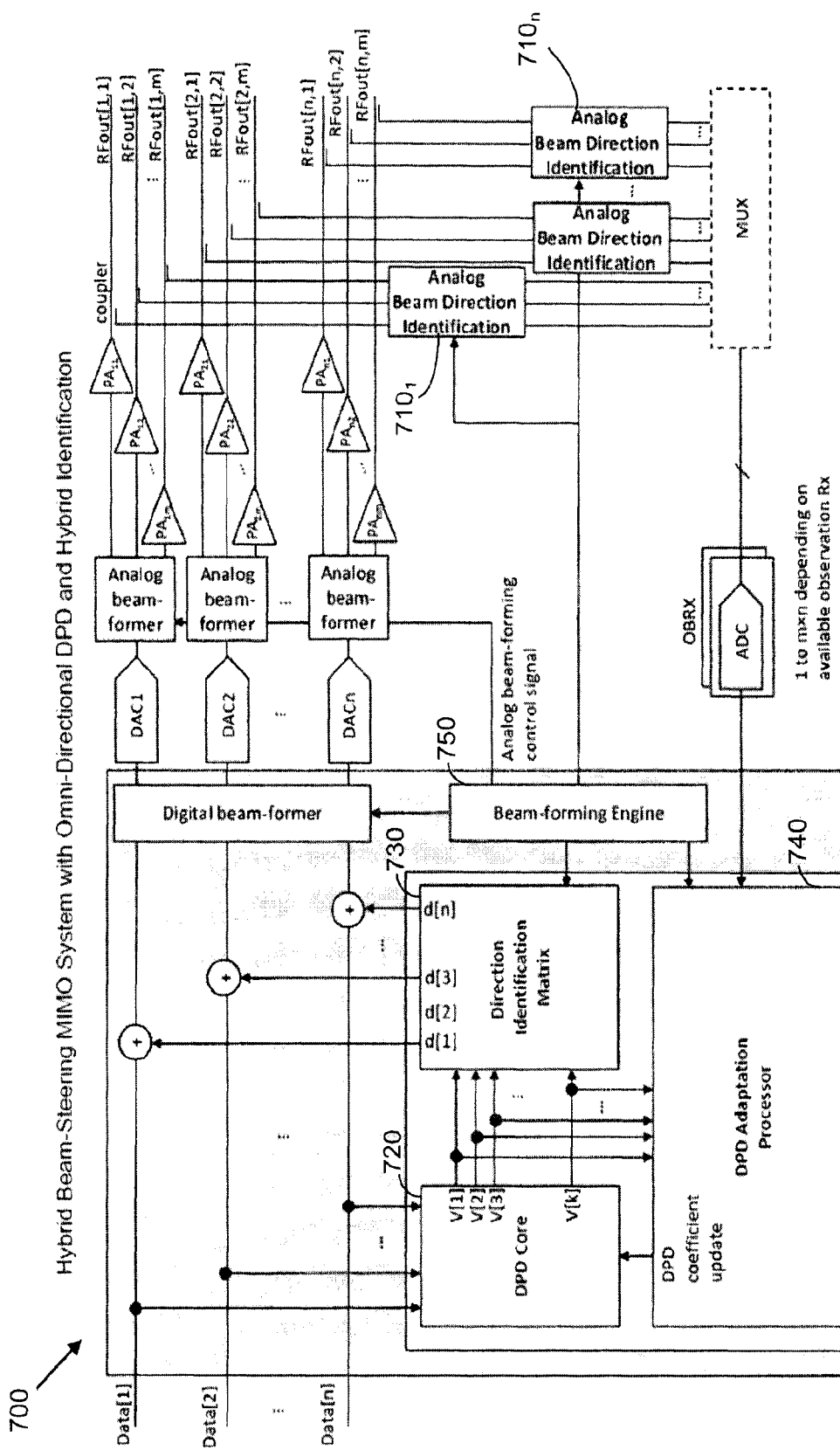
FIG. 7 is a schematic diagram of a further example of a digital pre-distortion beam-steering system.

Turning next to FIG. 7, a schematic diagram is provided of a further example pre-distortion beam-steering system 700. The system 700 is similar to the system 600 illustrated in FIG. 6, except that the system 700 includes analog beam direction identification units $710_{1-v}$ between the RF outputs of each PA and the observation receiver. The analog beam direction identification units $710_{1-v}$ could be implemented in the form of variable phase shifters or simply electrical delay lines in addition to a power combiner. The analog beam direction identification units $710_{1-v}$ converts m RF signals (e.g., in each group of PA's corresponding to one of the digital input paths) to j RF signals, where j<m (i.e., the analog beam direction identification units reduce the number of output signal information that needs to be processed from each group of PA's from m to j). In the case of using variable analog beam direction identification units, a beam-forming engine 750 is configured to control them and make the information available to a DPD adaption processor 740 (which may be similar to the DPD adaptation processor 640)

and the digital direction identification unit 730 (which may be similar to the direction identification matrix/unit 630 of FIG. 6). The implementation of the system 700 offloads some off the DPD adaptation computations to the analog domain, and thus reduces the digital processing complexity.

Figure 8:
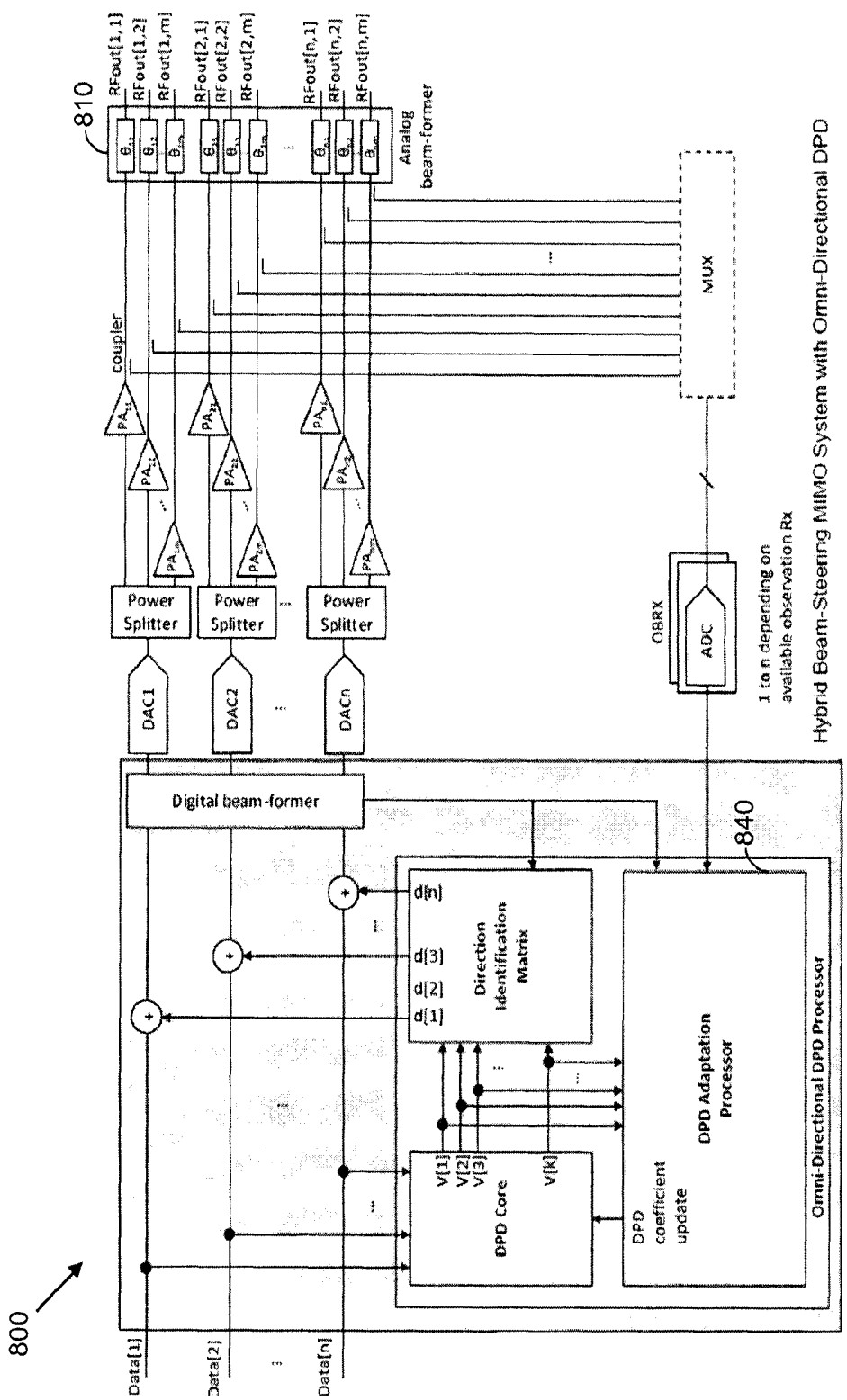
FIG. 8 is a schematic diagram of an additional example of a digital pre-distortion beam-steering system.

With reference to FIG. 8, a schematic diagram is provided of yet another example pre-distortion beam-steering system 800. The example system 800 is similar to some of the other system implementations described herein, including the systems 400, 500, and 600 of FIGS. 4-6, except that an analog beam former 810 is placed after the PA's depicted in FIG. 8. The analog beam former 810 has a relatively high complexity because the analog beam former 810 needs to handle signals with generally a higher power level. On the other hand, the increased complexity of the digital beam former 810 may be offset by the reduced complexity of implementing the digital part of the system since only the digital beam forming information needs to be made available to the DPD adaptation unit 840 (the DPD adaptation unit 840 may be similar, in configuration and/or functionality, to the DPD adaptation component 414 of FIG. 4, the adaptation processor 540 of FIG. 5A, or the adaptation processor 640 of FIG. 6).

Figure 9:
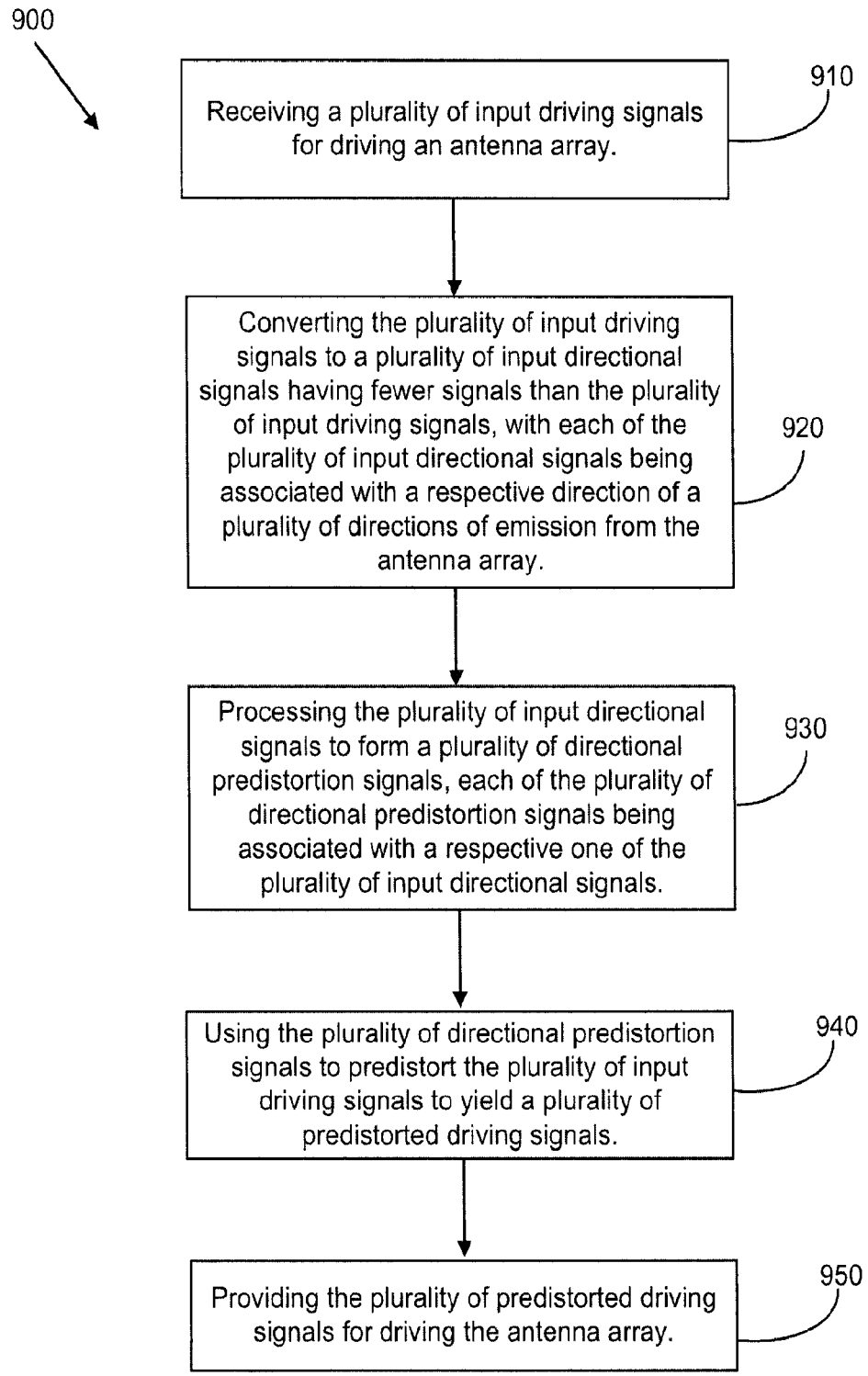
FIG. 9 is a flowchart of an example procedure for signal predistortion.

With reference next to FIG. 9, a flowchart of an example procedure 900 for signal predistortion is shown. The procedure 900 includes receiving 910 a plurality of input driving signals for driving an antenna array. In some embodiments, the plurality of input directional signals may be representative of respective signal strengths in a plurality of desired transmission directions. The input driving signals may have been configured to drive the antenna array to create a particular beam-steered (beamformed) emission pattern. However, due to non-linearities in the antenna array system (e.g., in the PA's, or other modules, constituting the antenna array), some spectral distortion may result that corresponds to a beam pattern that deviates from the desired or intended pattern.

The procedure 900 further includes converting 920 the plurality of input driving signals to a plurality of input directional signals having fewer signals (k) than the plurality of input driving signals (N), with each of the plurality of input directional signals being associated with a respective direction of a plurality of directions of emission from the antenna array. The conversion of the N input driving signals to k input directional signals (with k<N) may be performed, for example, using a direction identification matrix (which may be a module included within a DPD core/processor).

As further illustrated in FIG. 9, the procedure 900 additionally includes processing 930 the plurality of input directional signals (generated from the N input driving signals) to form a plurality of directional predistortion signals, with each of the plurality of directional predistortion signals being associated with a respective one of the plurality of input directional signals. The processing may be performed by a DPD core, such as the DPD core 412 of FIG. 4, the DPD core 520 of FIG. 5, or any of the other DPD processors/cores depicted in FIGS. 1-8. The DPD processing may be realized using predistortion parameters that pre-distort the input signals handled (in this case, the input directional signals, corresponding, for example, to the signals 402 of FIG. 4). The predistortion is configured to predistort the input signals such that the resulting output signals will, after further processing by downstream modules, correct the original input driving signals in such a way that when the corrected signals are fed to the antenna array, the resulting RF emissions will more closely match the intended RF pattern (or, alternatively, the resulting pattern will achieve some enhancement/optimization criterion or objective).

As discussed herein, in some embodiments, the predistortion processing (digital predistortion (DPD) processing) uses an adaptive approach to adjustably control the predistortion parameters used by a predistortion processor. In such embodiments, the procedure 900 may further include determining a plurality of sensed directional signals, of the same number (e.g., the value k) of signals as the plurality of input directional signals, and using at least the plurality of sensed directional signals to determine values of predistortion configuration parameters. The predistortion configuration parameters may be used to process the plurality of input directional signals to form the plurality of directional predistortion signals. Using the plurality of sensed directional signals to determine the values of the predistortion configuration parameters may include performing one or more of, for example, optimization of the predistortion configuration parameters based on one or more objective functions computed according to at least the plurality of sensed directional signals, and/or selection of one or more pre-determined sets of predistortion coefficients based on a criterion computed according to the at least the plurality of sensed directional signals. The procedure may additionally include further using the plurality of input directional signals to determine the values of the predistortion configuration parameters.

With continued reference to FIG. 9, the procedure 900 additionally includes using 940 the plurality of directional predistortion signals to predistort the plurality of input driving signals to yield a plurality of predistorted driving signals, and providing 950 the plurality of predistorted driving signals for driving the antenna array. In some embodiments, using the directional predistortion signals to predistort the input driving signals to yield the plurality of predistorted driving signals may include converting (e.g., by a direction identification unit/matrix, or a beam-steering converter, such as the modules 426 or 530 of FIGS. 4 and 5A, denoted as modules $L^+$) the directional predistortion signals to a plurality of correcting predistortion signals of the same number of signals as the input driving signals i.e., converting k directional predistortion signals to N correcting predistortion signals). The plurality of correcting predistortion signals are then combined (e.g., adding or performing some other combining operation via filtering or processor-based computations) to respective ones of the plurality of input driving signals to generate the plurality of predistorted driving signals. In some embodiments, converting the plurality of input driving signals to the plurality of input directional signals may include mapping the plurality of input driving signals to the plurality of input directional signals according to a mapping function. Converting the plurality of directional predistortion signals to the plurality of correcting predistortion signals may, in such embodiments, include mapping the plurality of directional predistortion signals to the plurality of correcting predistortion signals according to an inverse function of the mapping function.

In some implementations, the procedure 900 may further include determining the plurality of directions of emission. In such embodiments, converting the plurality of input driving signals to the plurality of input directional signals may be performed according to the determined plurality of directions of emission. Driving the antenna array with the plurality of predistorted driving signals may be performed to emit a directional beam from the antenna array in a beam direction, with the plurality of directions of emissions being determined from the beam direction.

In some embodiments, the antenna array may include one or more power amplifiers with respective associated non-linear behavior. In such embodiments, using the plurality of input directional signals to form the plurality of directional predistortion signals may include pre-distorting the plurality of input directional signals according to adjustable predistortion configuration parameters to generate the plurality of directional predistortion signals that, when converted to the plurality of correcting predistortion signals and combined with the plurality of input driving signals causes a reduction in spectrum leakage resulting from the non-linear behavior of the power amplifiers.

While the discussion provided herein is made with respect to non-linear beam-steering systems, the non-linear effects by other types of non-linear systems may also be ameliorated by the approaches and solutions discussed herein.

In some implementations, a computer accessible non-transitory storage medium includes a stored data (e.g., constituting part of a database or data repository) representative of a system including some or all of the components of the systems described herein to perform digital predistortion for beam-steering. Generally speaking, a computer accessible storage medium may include any non-transitory storage media accessible by a computer during use to provide instructions and/or data to the computer. For example, a computer accessible storage medium may include storage media such as magnetic or optical disks and semiconductor (solid state) memories. The database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

Implementations of the approaches described above may be implemented in software, for example, using a general or special purpose processor that executes instructions stored on a non-transient computer readable medium. Some functions may be implemented in special-purpose hardware, for example, using Field Programmable Gate Arrays (FPGAs) or Application Specific Integrated Circuits (ASICs). A combination of software execution and special purpose hardware can be used.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" or "and" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limiting with respect to the scope of the appended claims, which follow. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method for signal predistortion comprising:
receiving a plurality of input driving signals for driving an antenna array;
converting the plurality of input driving signals to a plurality of input directional signals having fewer signals than the plurality of input driving signals, each of the plurality of input directional signals being associated with a respective direction of a plurality of directions of emission from the antenna array, wherein the plurality of directions of emission comprises a direction of a side lobe of an antenna pattern associated with the plurality of input driving signals;
processing the plurality of input directional signals to form a plurality of directional predistortion signals, each of the plurality of directional predistortion signals being associated with a respective one of the plurality of input directional signals;
determining a plurality of sensed directional signals, of the same number of signals as the plurality of input directional signals;
using at least the plurality of sensed directional signals to determine values of predistortion configuration parameters;
using the plurality of directional predistortion signals to predistort the plurality of input driving signals to yield a plurality of predistorted driving signals, wherein the predistortion configuration parameters are used to process the plurality of input directional signals to form the plurality of directional predistortion signals; and
providing the plurality of predistorted driving signals for driving the antenna array.

2. The method of claim 1, wherein using at least the plurality of sensed directional signals to determine the values of the predistortion configuration parameters comprises performing one or more of:

optimization of the predistortion configuration parameters based on one or more objective functions computed according to at least the plurality of sensed directional signals, or selection of one or more pre-determined sets of predistortion coefficients based on a criterion computed according to the at least the plurality of sensed directional signals.

3. The method of claim 1, further comprising:
further using the plurality of input directional signals to determine the values of the predistortion configuration parameters.

4. The method of claim 1, wherein using the directional predistortion signals to predistort the input driving signals to yield the plurality of predistorted driving signals includes:
converting the directional predistortion signals to a plurality of correcting predistortion signals of the same number of signals as the input driving signals; and
combining respective ones of the plurality of input driving signals and the plurality of correcting predistortion signals to generate the plurality of predistorted driving signals.

5. The method of claim 4, wherein converting the plurality of input driving signals to the plurality of input directional signals comprises:
mapping the plurality of input driving signals to the plurality of input directional signals according to a mapping function;
and wherein converting the plurality of directional predistortion signals to the plurality of correcting predistortion signals comprises mapping the plurality of directional predistortion signals to the plurality of correcting predistortion signals according to an inverse function of the mapping function.

6. The method of claim 1, further comprising:
determining the plurality of directions of emission;
wherein converting the plurality of input driving signals to the plurality of input directional signals is performed according to the determined plurality of directions of emission.

7. The method of claim 6, wherein driving the antenna array with the plurality of predistorted driving signals is performed to emit a directional beam from the antenna array in a beam direction, wherein the plurality of directions of emissions are determined from the beam direction.

8. The method of claim 1, wherein the plurality of input directional signals are representative of respective signal strengths in a plurality of desired transmission directions.

9. The method of claim 1, wherein the antenna array comprises one or more power amplifiers with respective associated non-linear behavior, and wherein using the plurality of input directional signals to form the plurality of directional predistortion signals comprises:
pre-distorting the plurality of input directional signals according to adjustable predistortion configuration parameters to generate the plurality of directional predistortion signals that, when converted to the plurality of correcting predistortion signals and combined with the plurality of input driving signals to yield and provide the plurality of predistorted driving signals cause a reduction in spectrum leakage resulting from the non-linear behavior of the power amplifiers.

10. A beam-steering pre-distorter system comprising:
a first mapper configured to accept a plurality of input driving signals to drive an antenna array and provide a plurality of input directional signals having fewer signals than the plurality of input driving signals, each of the plurality of input directional signals being associated with a respective direction of a plurality of directions of emission from the antenna array, wherein the plurality of directions of emission comprises a direction of a side lobe of an antenna pattern associated with the plurality of input driving signals;
a pre-distorter configured to process the plurality of input directional signals to form a plurality of directional predistortion signals, each of the plurality of directional predistortion signals being associated with a respective one of the plurality of input directional signals;
a beam-steering converter configured to determine a plurality of sensed directional signals, of the same number of signals as the plurality of input directional signals;
a digital predistorter adaptation component configured to use at least the plurality of sensed directional signals to determine values of predistortion configuration parameters, wherein the predistortion configuration parameters are used to process the plurality of input directional signals to form the plurality of directional predistortion signals; and
a filtering unit configured to use the plurality of directional predistortion signals to predistort the plurality of input driving signals to yield a plurality of predistorted driving signals, and provide the plurality of predistorted driving signals to drive the antenna array.

11. The beam-steering pre-distorter system of claim 10, wherein the digital predistorter adaptation component configured to use the plurality of sensed directional signals to determine the value of the predistortion configuration parameters is configured to perform one or more of:
optimization of the predistortion configuration parameters based on one or more objective functions computed according to at least the plurality of sensed directional signals, or selection of one or more pre-determined sets of predistortion coefficients based on a criterion computed according to the at least the plurality of sensed directional signals.

12. The beam-steering pre-distorter system of claim 10, wherein the digital predistorter adaptation component is further configured to:
further use the plurality of input directional signals to determine the values of the predistortion configuration parameters.

13. The beam-steering pre-distorter system of claim 10, wherein the filtering unit configured to use the directional predistortion signals to predistort the input driving signals to yield the plurality of predistorted driving signals comprises:
a beam-steering converter to convert the directional predistortion signals to a plurality of correcting predistortion signals of the same number of signals as the input driving signals; and
a signal combiner to combine respective ones of the plurality of input driving signals and the plurality of correcting predistortion signals to generate the plurality of predistorted driving signals.

14. The beam-steering pre-distorter system of claim 13, wherein the first mapper configured to provide the plurality of input directional signals is configured to map the plurality of input driving signals to the plurality of input directional signals according to a mapping function;
and wherein the beam-steering converter is configured to map the plurality of directional predistortion signals to the plurality of correcting predistortion signals according to an inverse function of the mapping function.

15. The beam-steering pre-distorter system of claim 10, further comprising:

a beam direction controller to determine the plurality of directions of emission;

wherein the first mapper is configured to convert the plurality of input driving signals to the plurality of input directional signals according to the determined plurality of directions of emission.

16. The beam-steering pre-distorter system of claim 10, wherein the antenna array comprises one or more power amplifiers with respective associated non-linear behavior, and wherein the pre-distorter configured to process the plurality of input directional signals to form the plurality of directional predistortion signals is configured to:

pre-distort the plurality of input directional signals according to adjustable predistortion configuration parameters to generate the plurality of directional pre-distortion signals that, when converted to the plurality of correcting predistortion signals, and combined with the plurality of input driving signals to provide the plurality of predistorted driving signals, cause a reduction in spectrum leakage resulting from the non-linear behavior of the power amplifiers.

17. A predistorter comprising circuitry configured to:
receive a plurality of input driving signals for driving an antenna array;
convert the plurality of input driving signals to a plurality of input directional signals having fewer signals than the plurality of input driving signals, each of the plurality of input directional signals being associated with a respective direction of a plurality of directions of emission from the antenna array, wherein the plurality of directions of emission comprises a direction of a side lobe of an antenna pattern associated with the plurality of input driving signals;
process the plurality of input directional signals to form a plurality of directional predistortion signals, each of the plurality of directional predistortion signals being associated with a respective one of the plurality of input directional signals;
determine a plurality of sensed directional signals, of the same number of signals as the plurality of input directional signals;
use at least the plurality of sensed directional signals to determine values of predistortion configuration parameters;
use the plurality of directional predistortion signals to predistort the plurality of input driving signals to yield a plurality of predistorted driving signals, wherein the predistortion configuration parameters are used to process the plurality of input directional signals to form the plurality of directional predistortion signals; and
provide the plurality of predistorted driving signals for driving the antenna array.

18. A non-transitory machine-readable medium having a design structure stored thereon, said design structure comprising elements, said design structure imparting functionality to a computer aided design system, when processed by said system, generates a machine-executable representation of a beam-steering pre-distorter, wherein said beam-steering pre-distorter system comprises:

a first mapper configured to accept a plurality of input driving signals to drive an antenna array and provide a plurality of input directional signals having fewer signals than the plurality of input driving signals, each of the plurality of input directional signals being associated with a respective direction of a plurality of directions of emission from the antenna array, wherein the plurality of directions of emission comprises a direction of a side lobe of an antenna pattern associated with the plurality of input driving signals;

a pre-distorter configured to process the plurality of input directional signals (402) to form a plurality of directional predistortion signals, each of the plurality of directional predistortion signals being associated with a respective one of the plurality of input directional signals;

a beam-steering converter configured to determine a plurality of sensed directional signals, of the same number of signals as the plurality of input directional signals;

a digital predistorter adaptation component configured to use at least the plurality of sensed directional signals to determine values of predistortion configuration parameters, wherein the predistortion configuration parameters are used to process the plurality of input directional signals to form the plurality of directional predistortion signals; and a filtering unit configured to use the plurality of directional predistortion signals to predistort the plurality of input driving signals to yield a plurality of predistorted driving signals, and provide the plurality of predistorted driving signals to drive the antenna array.

19. A non-transitory computer readable media programmed with a set of computer instructions executable on a processor that, when executed, cause the operations comprising:

receiving a plurality of input driving signals for driving an antenna array;
converting the plurality of input driving signals to a plurality of input directional signals having fewer signals than the plurality of input driving signals, each of the plurality of input directional signals being associated with a respective direction of a plurality of directions of emission from the antenna array, wherein the plurality of directions of emission comprises a direction of a side lobe of an antenna pattern associated with the plurality of input driving signals;
processing the plurality of input directional signals to form a plurality of directional predistortion signals, each of the plurality of directional predistortion signals being associated with a respective one of the plurality of input directional signals;
determining a plurality of sensed directional signals, of the same number of signals as the plurality of input directional signals;
using at least the plurality of sensed directional signals to determine values of predistortion configuration parameters;
using the plurality of directional predistortion signals to predistort the plurality of input driving signals to yield a plurality of predistorted driving signals, wherein the predistortion configuration parameters are used to process the plurality of input directional signals to form the plurality of directional predistortion signals; and
providing the plurality of predistorted driving signals for driving the antenna array.

20. The method of claim 1 wherein the plurality of directions of emission from the antenna array further comprises a direction of the main lobe of the antenna pattern, wherein at least one of the plurality of input directional signals is associated the direction of the side lobe and another of the plurality of input directional signals is associated with the direction of the main lobe.

21. The method of claim 20 wherein using the plurality of directional predistortion signals to predistort the plurality of input driving signals comprises reducing adjacent channel leakage in at least the direction of the side lobe.

22. The method of claim 20 wherein the plurality of directions of emission from the antenna array further comprises a direction of a spectral emission mask violation predicted from the plurality of input driving signals.

23. The method of claim 6 wherein determining the plurality of directions of emission comprises determining a direction of a main beam and one of more directions of side lobes of an antenna pattern associated with the plurality of input driving signals.

24. The method of claim 6 wherein determining the plurality of directions of emission comprises determining a direction of spectral emission mask violation.

25. The method of claim 24 wherein determining the direction of the spectral emission mask violation comprises predicting said direction from the plurality of input driving signals.

26. A method for signal predistortion comprising:
receiving a plurality of input driving signals for driving an antenna array;
converting the plurality of input driving signals to a plurality of input directional signals having fewer signals than the plurality of input driving signals, each of the plurality of input directional signals being associated with a respective direction of a plurality of directions of emission from the antenna array, wherein the plurality of directions of emission comprises a direction of a side lobe of an antenna pattern associated with the plurality of input driving signals;
processing the plurality of input directional signals to form a plurality of directional predistortion signals, each of the plurality of directional predistortion signals being associated with a respective one of the plurality of input directional signals;
using the plurality of directional predistortion signals to predistort the plurality of input driving signals to yield a plurality of predistorted driving signals; and
providing the plurality of predistorted driving signals for driving the antenna array;
wherein the antenna array comprises one or more power amplifiers with respective associated non-linear behavior, and wherein using the plurality of input directional signals to form the plurality of directional predistortion signals comprises:
pre-distorting the plurality of input directional signals according to adjustable predistortion configuration parameters to generate the plurality of directional pre-distortion signals that, when converted to the plurality of correcting predistortion signals and combined with the plurality of input driving signals to yield and provide the plurality of predistorted driving signals cause a reduction in spectrum leakage resulting from the non-linear behavior of the power amplifiers.

27. A beam-steering pre-distorter system comprising:
a first mapper configured to accept a plurality of input driving signals to drive an antenna array and provide a plurality of input directional signals having fewer signals than the plurality of input driving signals, each of the plurality of input directional signals being associated with a respective direction of a plurality of directions of emission from the antenna array, wherein the plurality of directions of emission comprises a direction of a side lobe of an antenna pattern associated with the plurality of input driving signals;
a pre-distorter configured to process the plurality of input directional signals to form a plurality of directional predistortion signals, each of the plurality of directional predistortion signals being associated with a respective one of the plurality of input directional signals;
a filtering unit configured to use the plurality of directional predistortion signals to predistort the plurality of input driving signals to yield a plurality of predistorted driving signals, and provide the plurality of predistorted driving signals to drive the antenna array;
wherein the antenna array comprises one or more power amplifiers with respective associated non-linear behavior, and wherein the pre-distorter configured to process the plurality of input directional signals to form the plurality of directional predistortion signals is configured to:
pre-distort the plurality of input directional signals according to adjustable predistortion configuration parameters to generate the plurality of directional predistortion signals that, when converted to the plurality of correcting predistortion signals, and combined with the plurality of input driving signals to provide the plurality of predistorted driving signals, cause a reduction in spectrum leakage resulting from the non-linear behavior of the power amplifiers.

28. A method for signal predistortion comprising:
receiving a plurality of input driving signals for driving an antenna array;
converting the plurality of input driving signals to a plurality of input directional signals having fewer signals than the plurality of input driving signals, each of the plurality of input directional signals being associated with a respective direction of a plurality of directions of emission from the antenna array, wherein the plurality of directions of emission comprises a direction of a side lobe of an antenna pattern associated with the plurality of input driving signals;
processing the plurality of input directional signals to form a plurality of directional predistortion signals, each of the plurality of directional predistortion signals being associated with a respective one of the plurality of input directional signals;
using the plurality of directional predistortion signals to predistort the plurality of input driving signals to yield a plurality of predistorted driving signals; and
providing the plurality of predistorted driving signals for driving the antenna array;
wherein the plurality of directions of emission from the antenna array further comprises a direction of the main lobe of the antenna pattern, wherein at least one of the plurality of input directional signals is associated the direction of the side lobe and another of the plurality of input directional signals is associated with the direction of the main lobe; and
wherein the plurality of directions of emission from the antenna array further comprises a direction of a spectral emission mask violation predicted from the plurality of input driving signals.

* * * * *